(12) United States Patent
Nagai

(10) Patent No.: US 7,768,082 B2
(45) Date of Patent: Aug. 3, 2010

(54) SURFACE-SHAPE SENSOR AND METHOD OF MANUFACTURING THE SAME

(75) Inventor: Kouichi Nagai, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 168 days.

(21) Appl. No.: 11/838,469

(22) Filed: Aug. 14, 2007

(65) Prior Publication Data
US 2008/0042226 A1 Feb. 21, 2008

(30) Foreign Application Priority Data
Aug. 16, 2006 (JP) ............................. 2006-222015

(51) Int. Cl.
*H01L 29/84* (2006.01)
*H01L 21/4763* (2006.01)
(52) U.S. Cl. .................. 257/417; 257/414; 257/415
(58) Field of Classification Search ............... 438/151, 438/158, 197, 238, 239, 244, 250, 253, 3; 257/335, 520, 417, 57–66, 295–316, 414, 257/415; 361/306, 321
See application file for complete search history.

(56) References Cited
U.S. PATENT DOCUMENTS

| | | | | |
|---|---|---|---|---|
| 6,344,888 | B2 * | 2/2002 | Yasukawa | ............ 349/113 |
| 7,045,379 | B2 * | 5/2006 | Tanabe et al. | .............. 438/48 |
| 7,193,296 | B2 * | 3/2007 | Fujita | .................... 257/620 |
| 2003/0011022 | A1 * | 1/2003 | Manabe | ................. 257/314 |
| 2003/0179001 | A1 * | 9/2003 | Ito et al. | ................ 324/661 |
| 2005/0118809 | A1 * | 6/2005 | Noguchi et al. | ........... 438/687 |
| 2005/0127395 | A1 * | 6/2005 | Saigoh et al. | ............. 257/127 |
| 2005/0259853 | A1 * | 11/2005 | Miyai et al. | ............... 382/124 |
| 2006/0159912 | A1 * | 7/2006 | Haldeman | ................ 428/336 |

FOREIGN PATENT DOCUMENTS

| | | | |
|---|---|---|---|
| JP | 61221883 | A | 10/1986 |
| JP | 561965 | A | 3/1993 |
| JP | 7168930 | A | 7/1995 |
| JP | 2000213908 | A | 8/2000 |
| JP | 2003172602 | A | 6/2003 |
| JP | 2003269907 | A | 9/2003 |
| JP | 2005159333 | A | 6/2005 |
| JP | 2005326167 | A | 11/2005 |

* cited by examiner

*Primary Examiner*—Thanh V Pham
*Assistant Examiner*—Errol Fernandes
(74) *Attorney, Agent, or Firm*—Westerman, Hattori, Daniels & Adrian, LLP

(57) ABSTRACT

According to the present embodiment, a surface-shape sensor is provided. The surface-shape sensor includes a silicon substrate, an interlayer insulating film formed over the silicon substrate, a first moisture-barrier insulating film formed on the interlayer insulating film, a detection-electrode film formed on the first moisture-barrier insulating film, a second moisture-barrier insulating film formed on the detection-electrode film and a protection insulating film formed on the second moisture-barrier insulating film and provided with a window on the detection electrode film.

18 Claims, 26 Drawing Sheets

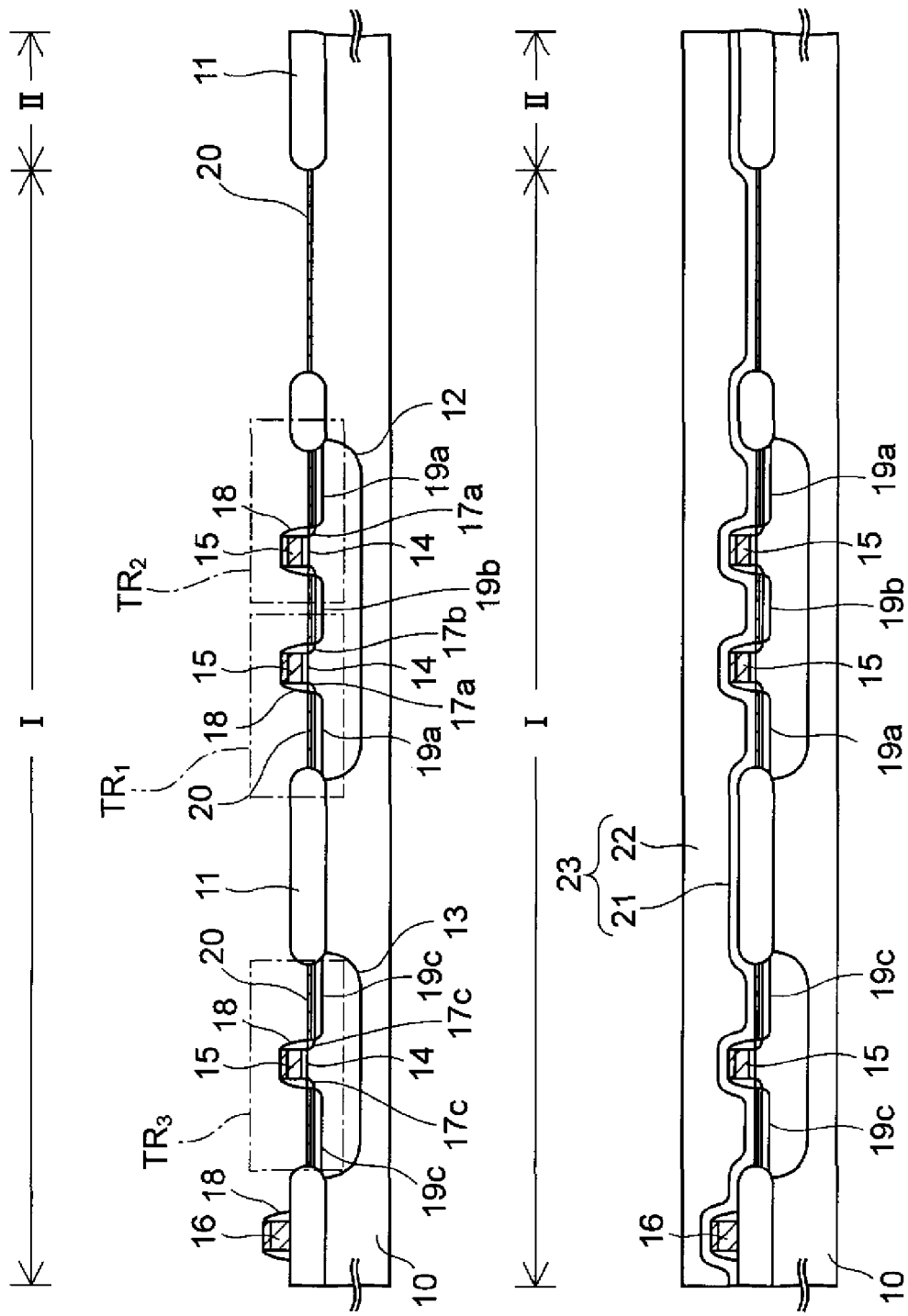

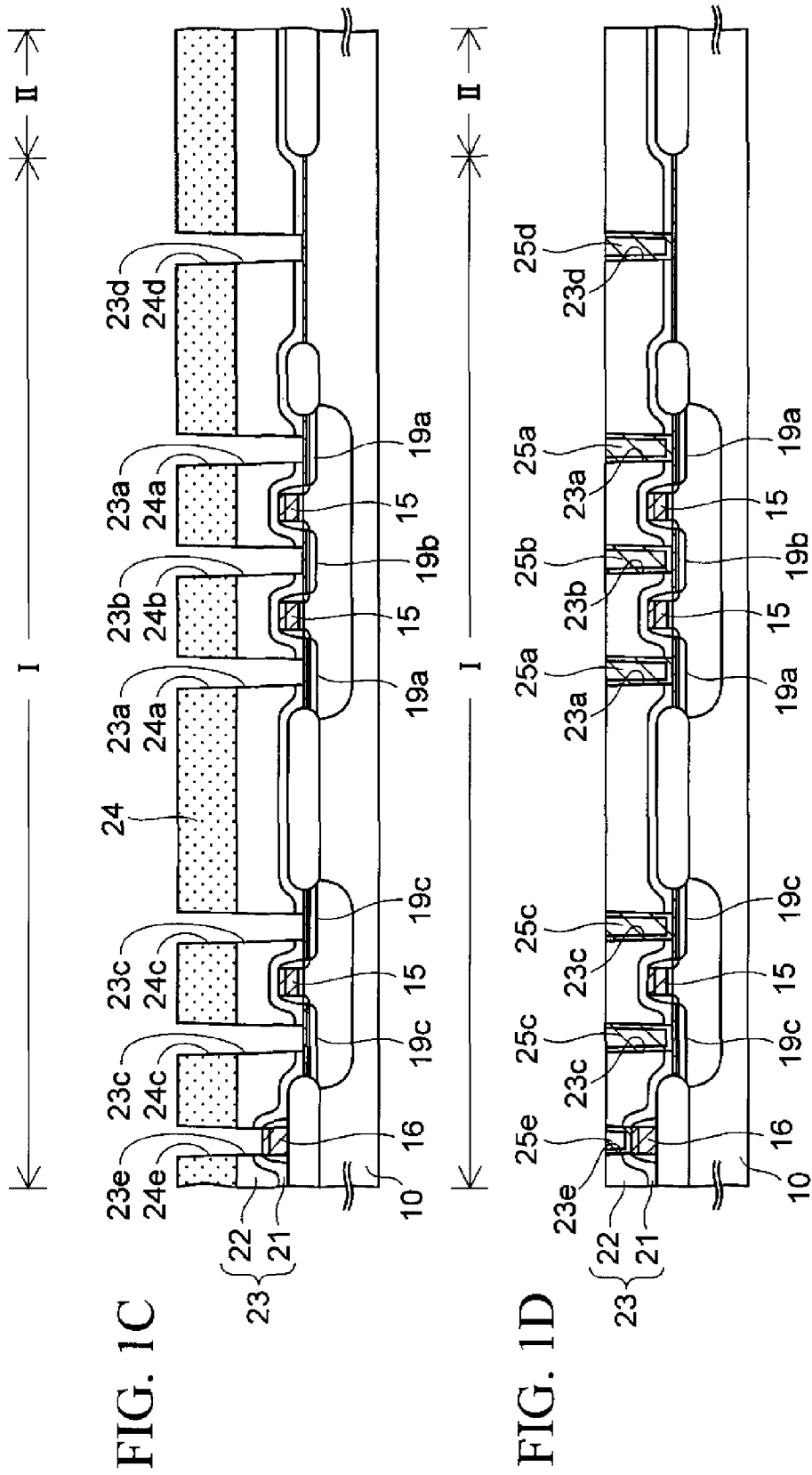

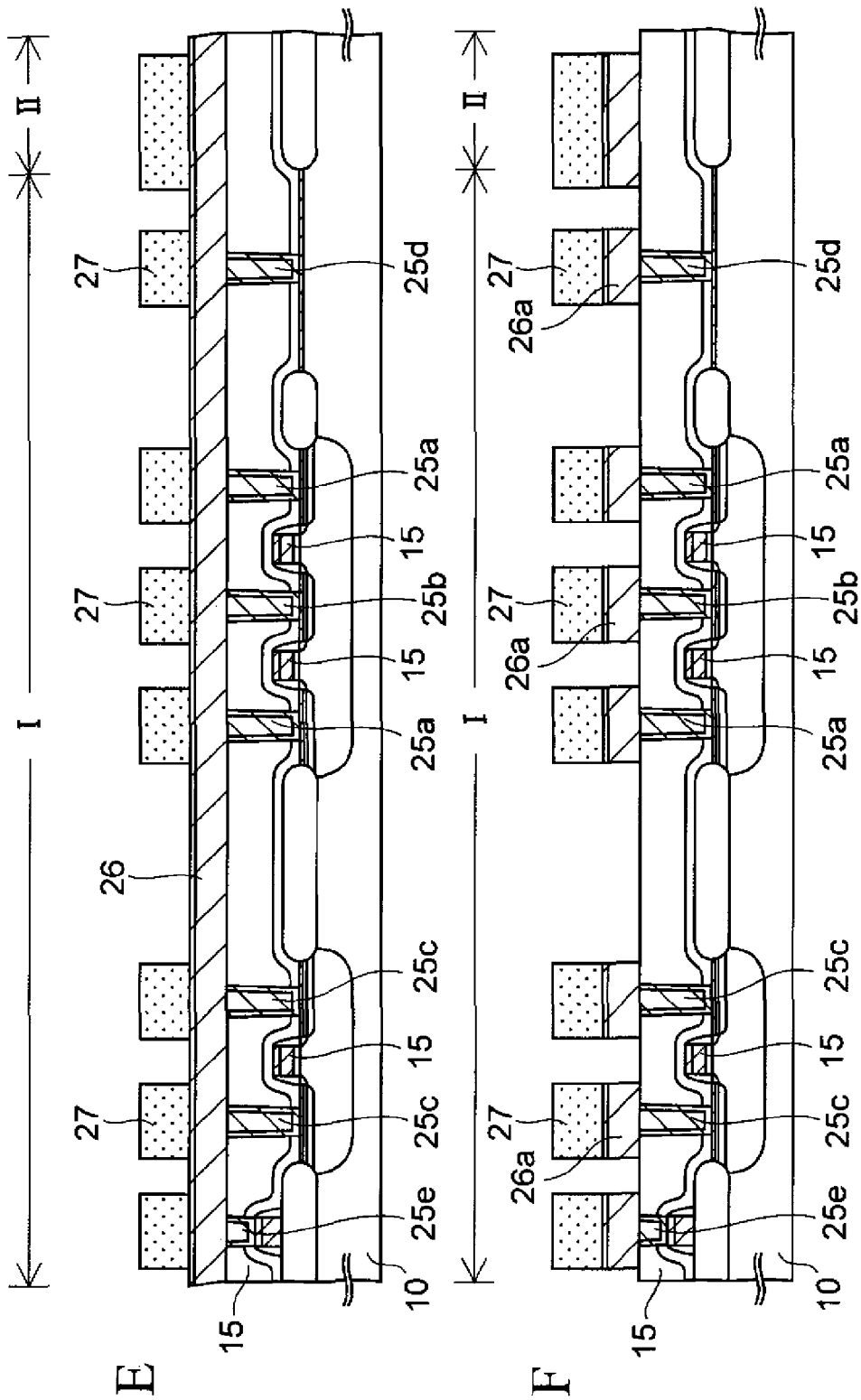

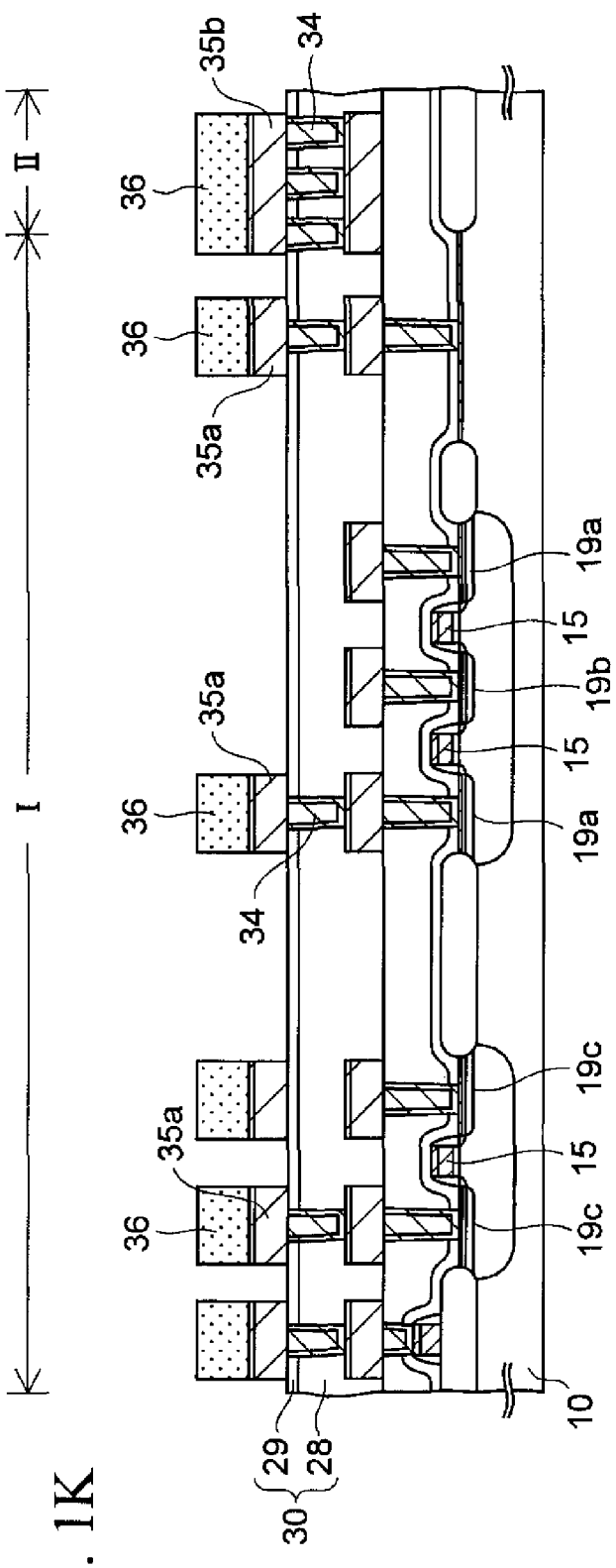

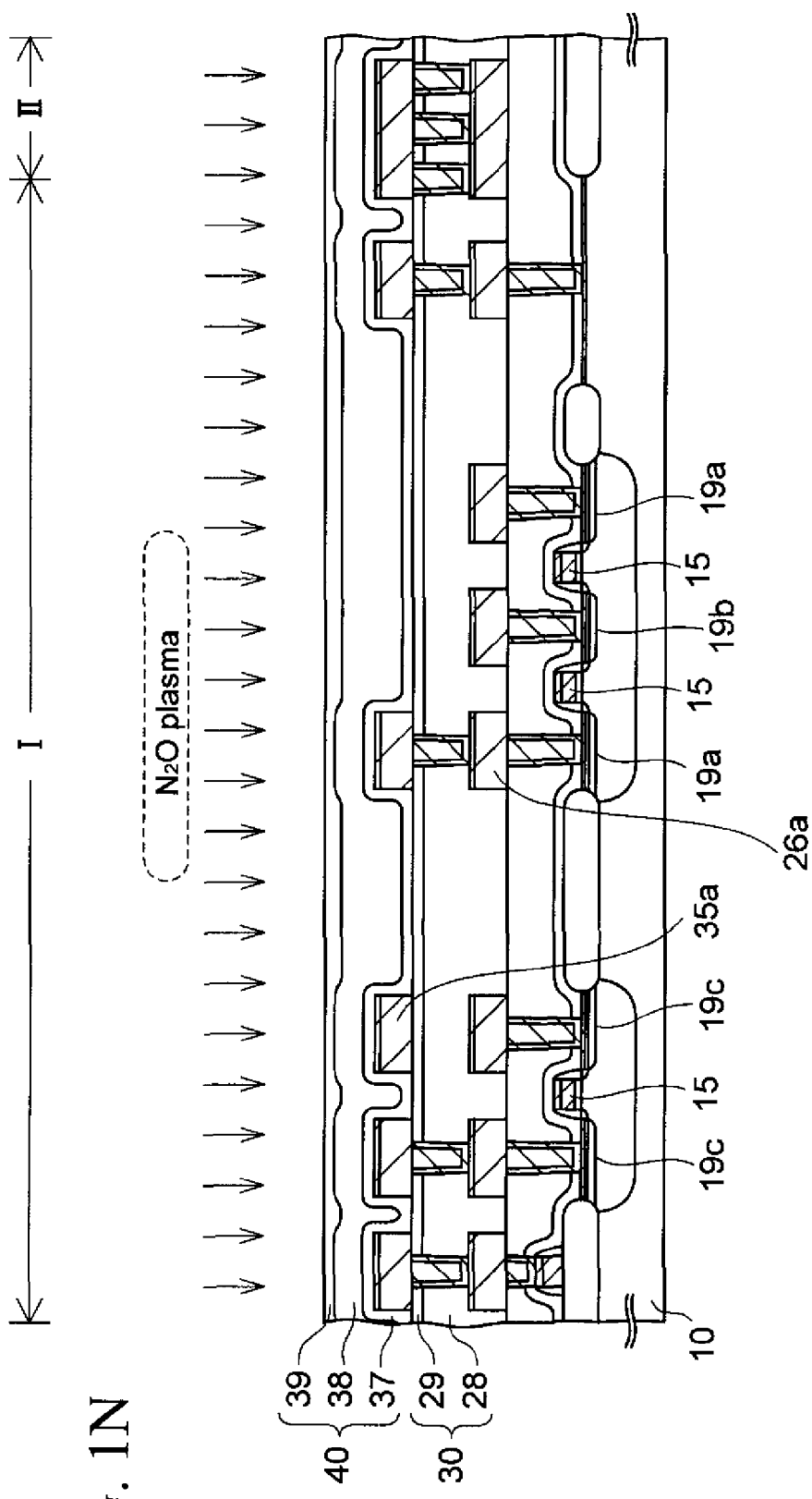

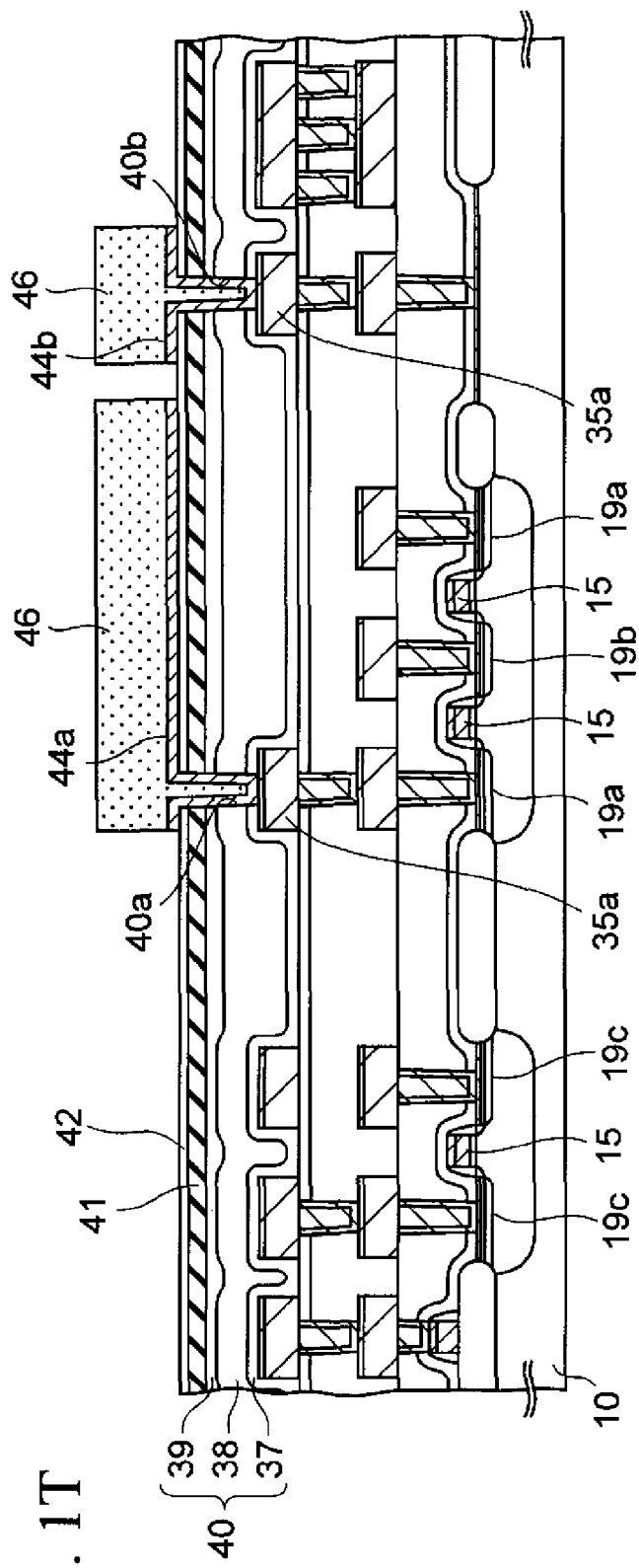

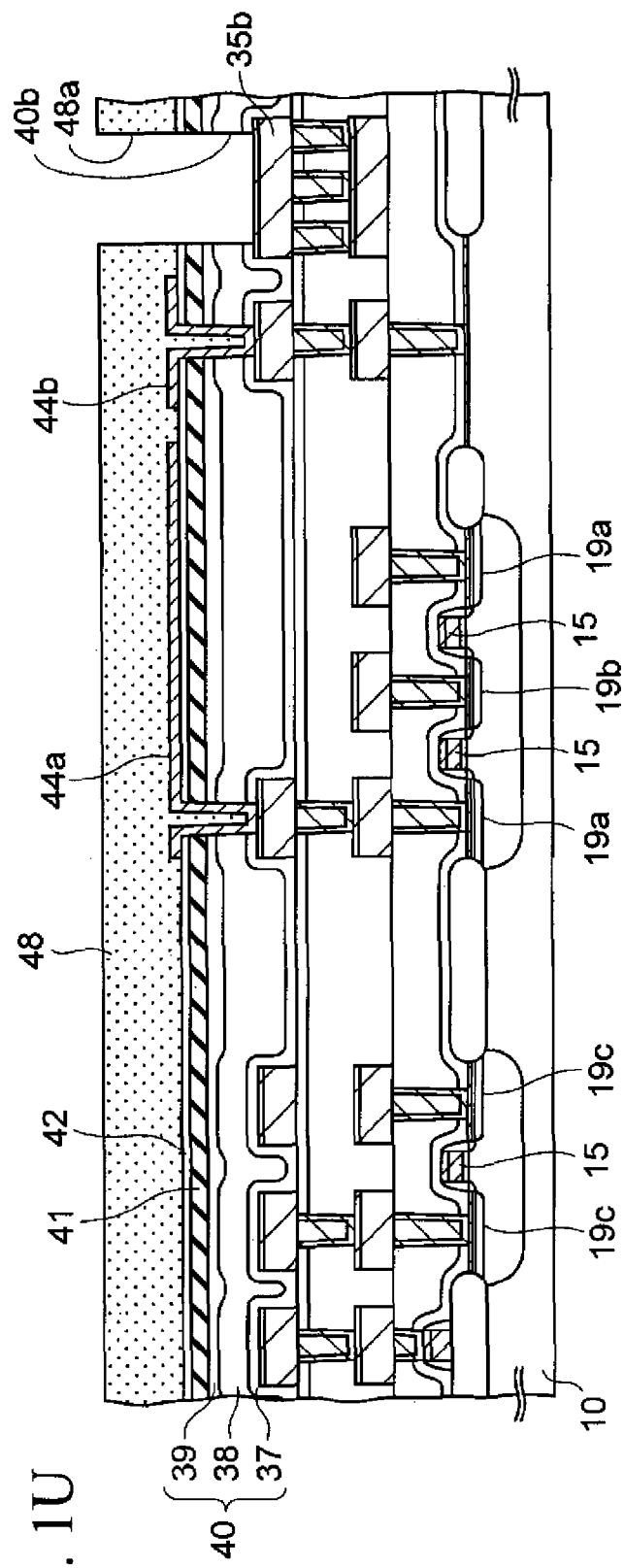

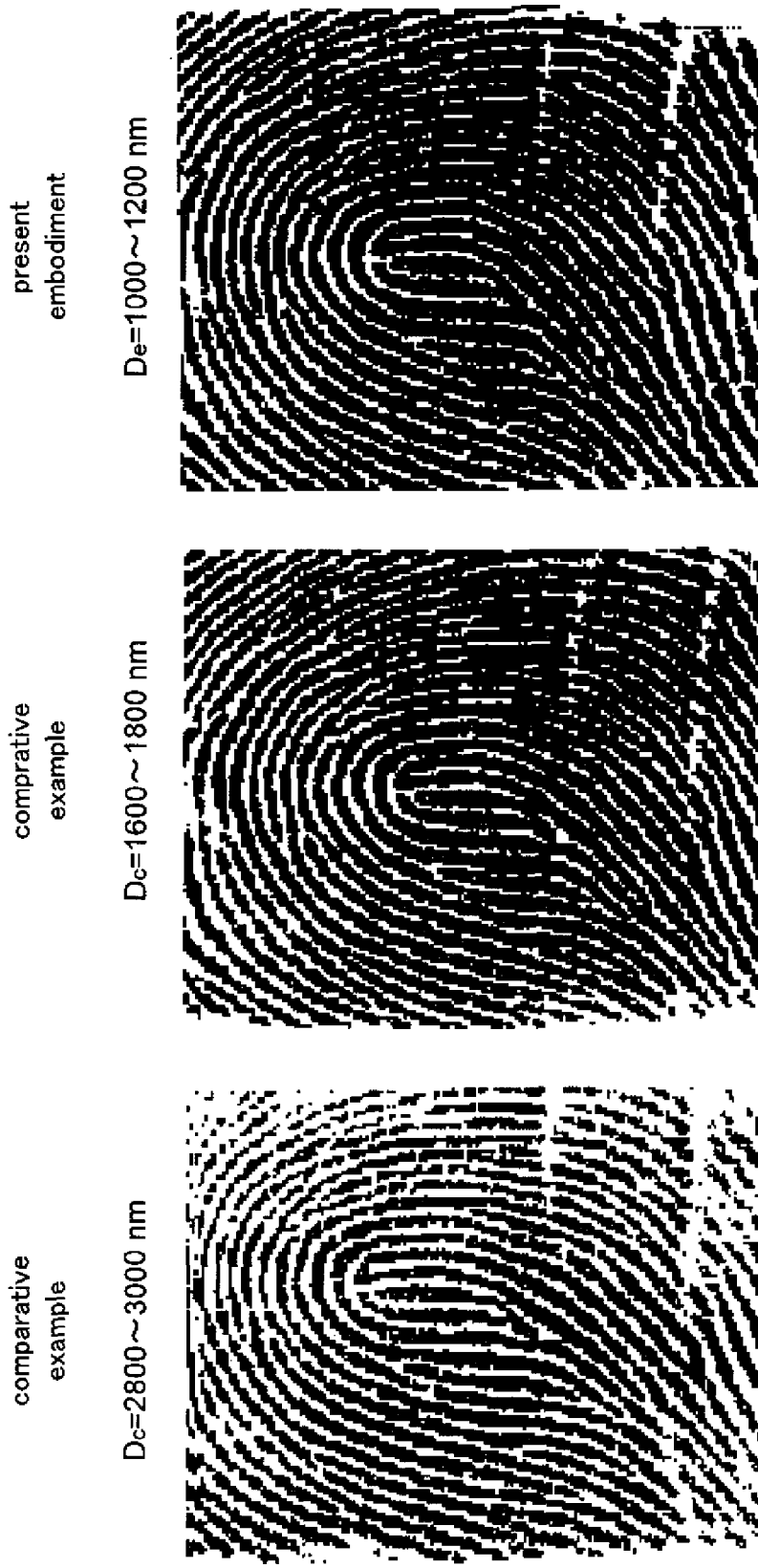

SURFACE-SHAPE SENSOR AND METHOD OF MANUFACTURING THE SAME

CROSS-REFERENCE TO RELATED APPLICATIONS

This application is based on and claims priority of Japanese Patent Application No. 2006-222015 filed on Aug. 16, 2006, the entire contents of which are incorporated herein by reference.

BACKGROUND

1. Field

The present embodiment relates to a surface-shape sensor and a method of manufacturing the surface-shape sensor.

2. Description of the Related Art

Biometrics is a way of identity verification using physical characteristics, and is a security technology to protect banking cards and electronic money from unauthorized use. As the society today has become more and more information-oriented, biometrics authentication technologies have been put into practical use. Palm-vein-pattern authentication and voiceprint authentication are examples of biometrics authentication technologies, but above all, fingerprint authentication, a biometrics technology using fingerprints, has been studied a lot thus far.

For example, Japanese Unexamined Patent Application Publication No. Sho 61-221883 discloses an optical fingerprint matching technology using a reflect light produced when a fingerprint is lit.

Japanese Unexamined Patent Application Publication No. Hei 5-61965 discloses a fingerprint matching technology in which a piezoelectric thin film is used for reading the difference in stress produced by the ridge and valley on the surface of finger, i.e. fingerprint.

Japanese Unexamined Patent Application Publication No. Hei 7-168930 discloses a finger print matching technology using a pressure-sensitive sheet. This sensing technology is based on changes in resistance or in capacitance produced when a finger touches the sheet.

Apart from the technologies mentioned above, technologies related to the present application is disclosed in: Japanese Patent Application Laid-open Publication No. 2005-159333, Japanese Patent Application Laid-open Publication No. 2005-326167, Japanese Patent Application Laid-open Publication No. 2000-213908.

SUMMARY

According to one aspect according to the present embodiment, there is provided a surface-shape sensor including a semiconductor substrate, an interlayer insulating film formed over the semiconductor substrate, a first moisture-barrier insulating film formed on the interlayer insulating film, a detection-electrode film formed on the first moisture-barrier insulating film, a second moisture-barrier insulating film formed on the detection-electrode film, and a protection insulating film formed on the second moisture-barrier insulating film and having a window on the detection electrode film.

BRIEF DESCRIPTION OF THE DRAWINGS

FIGS. 6A and 6B are images of fingerprint obtained by use of surface-shape sensor according to the comparative example, and FIG. 6C is an image of fingerprint obtained by use of surface-shape sensor according to the embodiment.

DESCRIPTION OF THE PREFERRED EMBODIMENTS

Those technologies described in the Description of the Related Art, however, have problems or difficulties. The technology of Japanese Unexamined Patent Application Publication No. Sho 61-221883, employing an optical method, is difficult to be made compact in size. A problem of the technology is its lacking of versatility, that is, its limited uses. In addition, use of a pressure-sensitive sheet in the technology of Japanese Unexamined Patent Application Publication No. Hei 7-168930 is difficult to be put into practical use. This is because the pressure-sensitive sheet is made of a special material, and its processing is difficult.

A technology for solving these problems is disclosed in Japanese Patent Application Laid-open Publication No. 2003-269907. The disclosed technology is a capacitance-type fingerprint sensor (surface-shape sensor) formed on a semiconductor substrate. In this technology, each of a plurality of detection-electrode films formed in an array on a semiconductor substrate and the skin, facing each other, function as electrodes of capacitors. The distance between electrodes in a capacitor varies in accordance with ridges and valleys of fingerprint. Consequently, by making each detection-electrode film function as a picture element and then sensing the capacitance of each capacitor, a visualized image of fingerprint is obtained. The fingerprint sensor of this type does not need any special interface, so that the sensor of this type can be made more compact in size than an optical-type sensor.

The capacitance-type fingerprint sensor of this type needs a structure capable of blocking external moisture, and preventing the element from being damaged by the moisture.

An example of such a moisture-blocking structure includes a silicon-nitride film formed as a passivation film as shown in the technology disclosed in Japanese Patent Application Laid-open Publication No. 2003-269907. Also, in the technology disclosed in Japanese Patent Application Laid-open Publication No. 2003-172602, a silicon-nitride film, which has an excellent property as a moisture barrier, is formed to avoid deterioration of the substrate due to the moisture.

What follows is a detail description of a capacitance-type surface-shape sensor according to an embodiment, and the description will be given by referring to accompanying drawings.

Figure 1G:
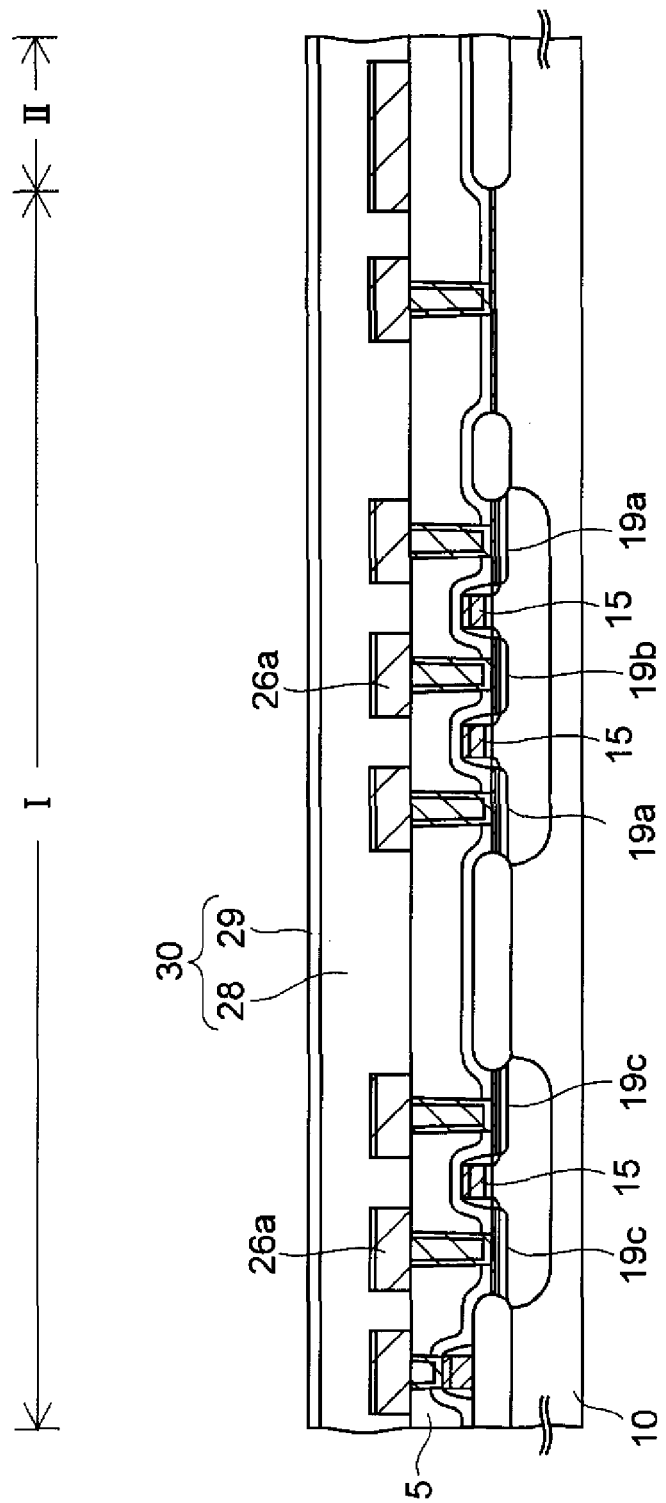
FIG. 1A to 1X are cross-sectional views each illustrating a surface-shape sensor in the process of manufacturing according to the present embodiment.
Figure 1H:
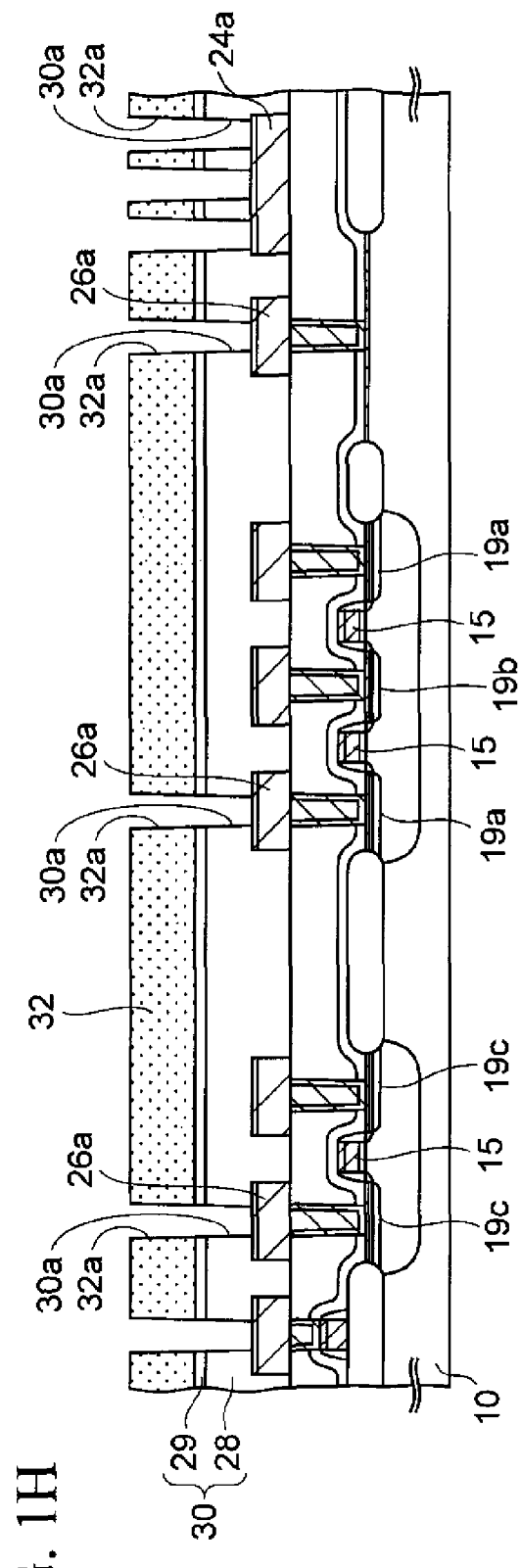
Figure 1I:
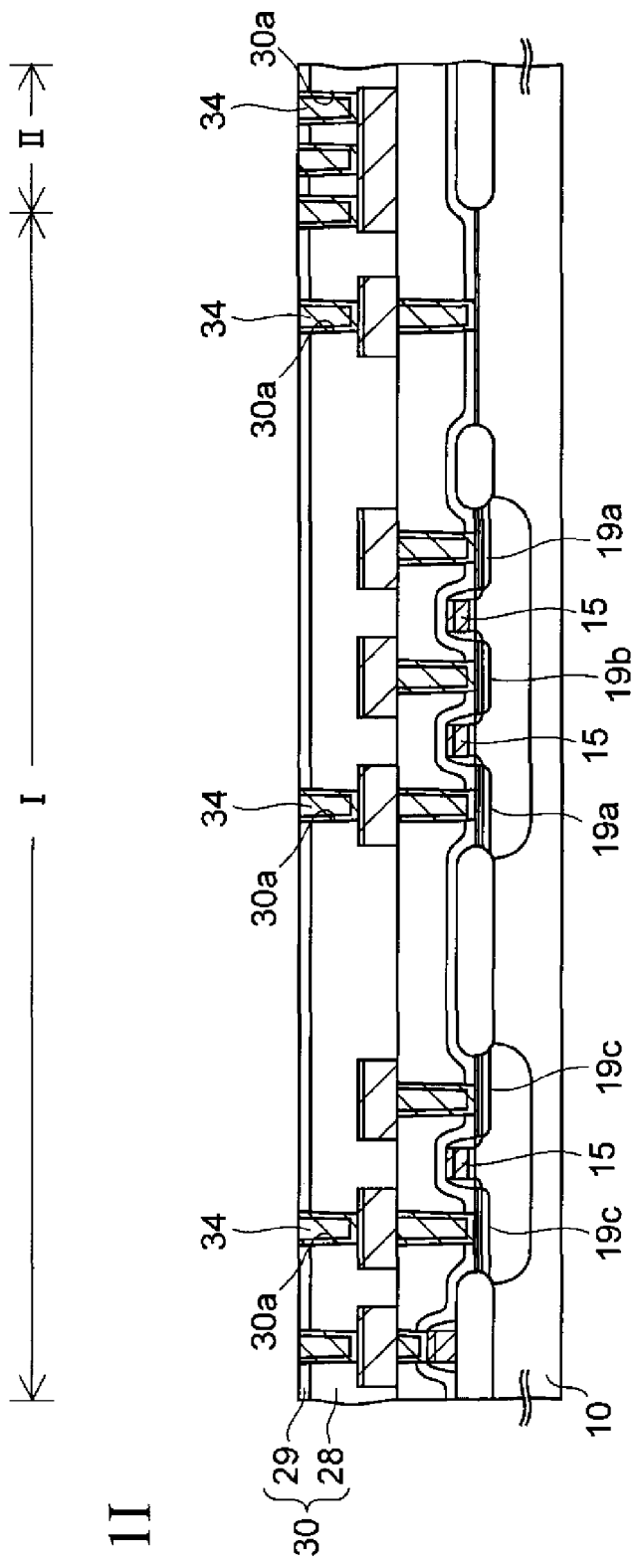
Figure 1J:
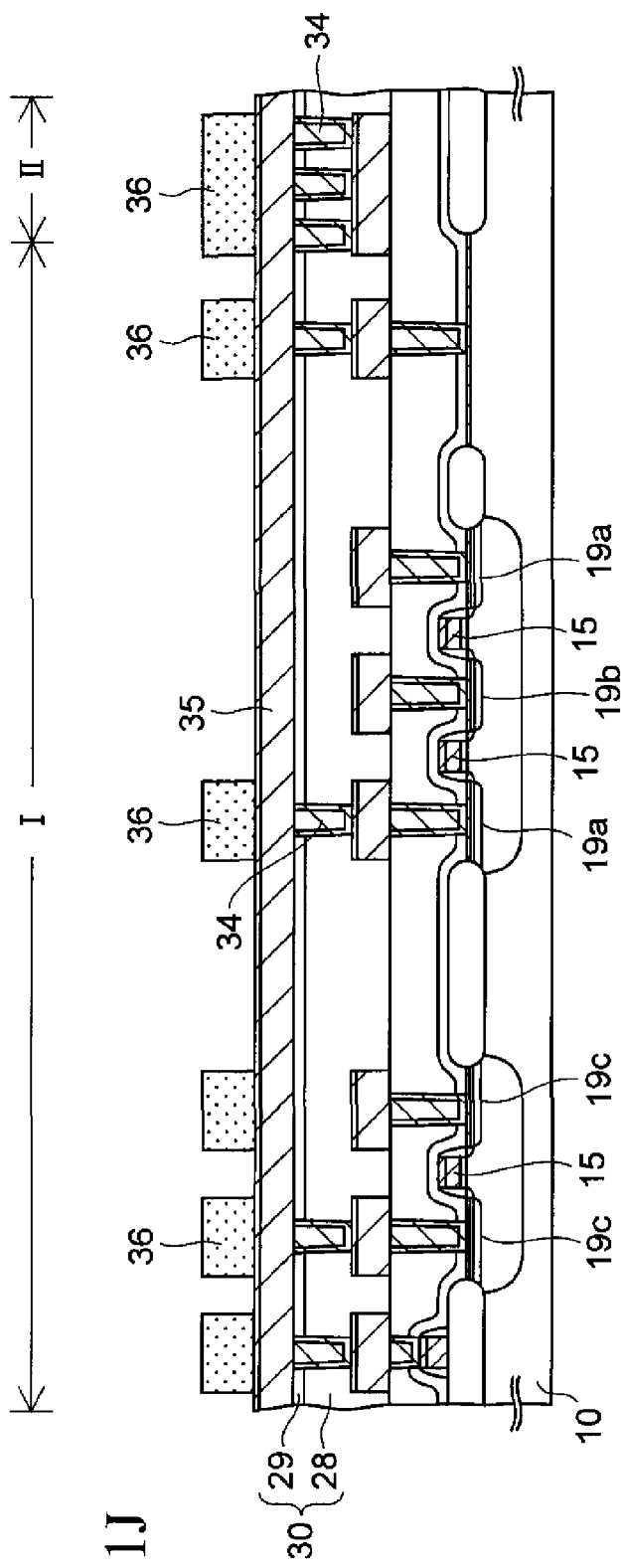
Figure 1L:
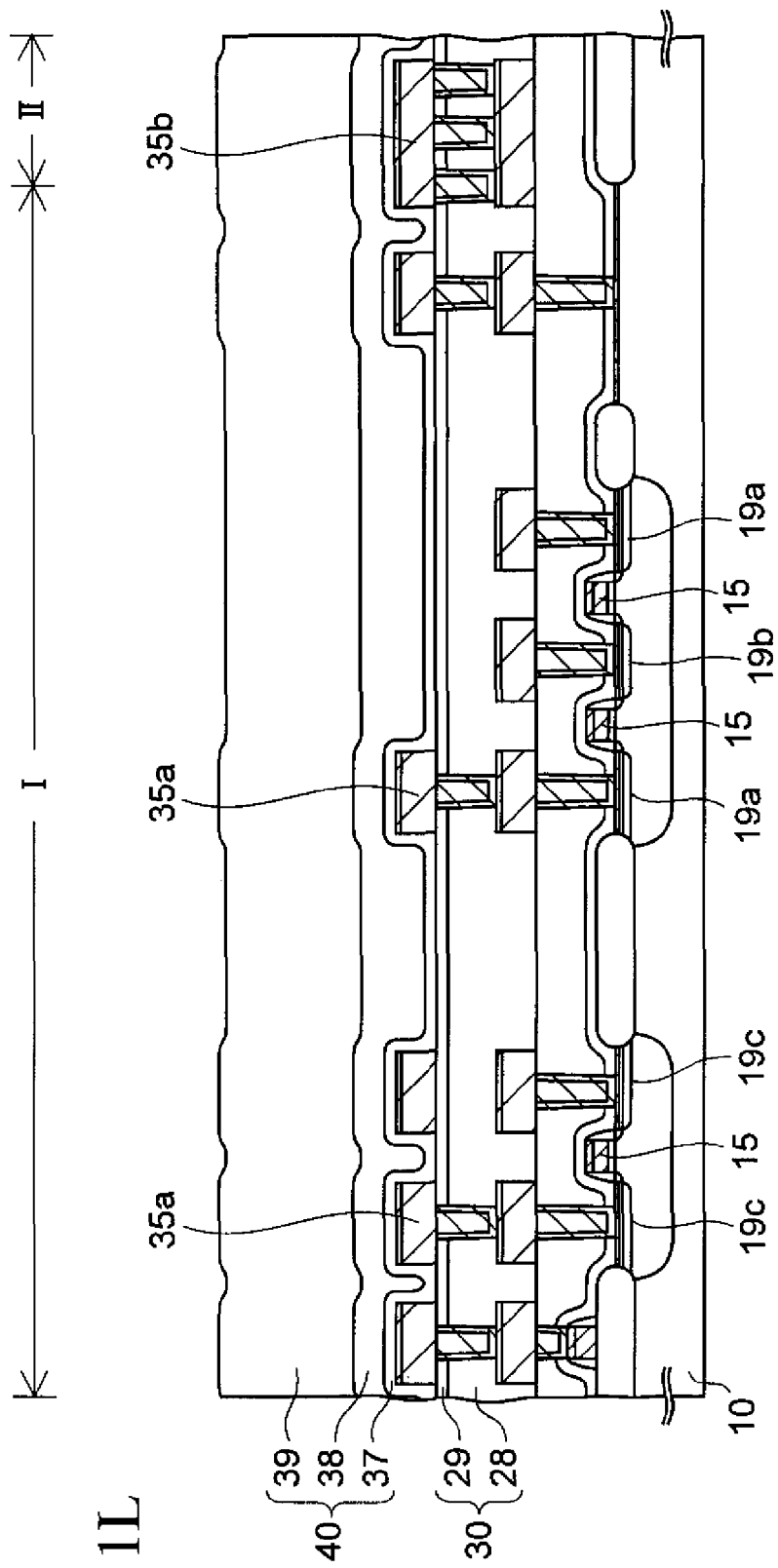
Figure 1M:
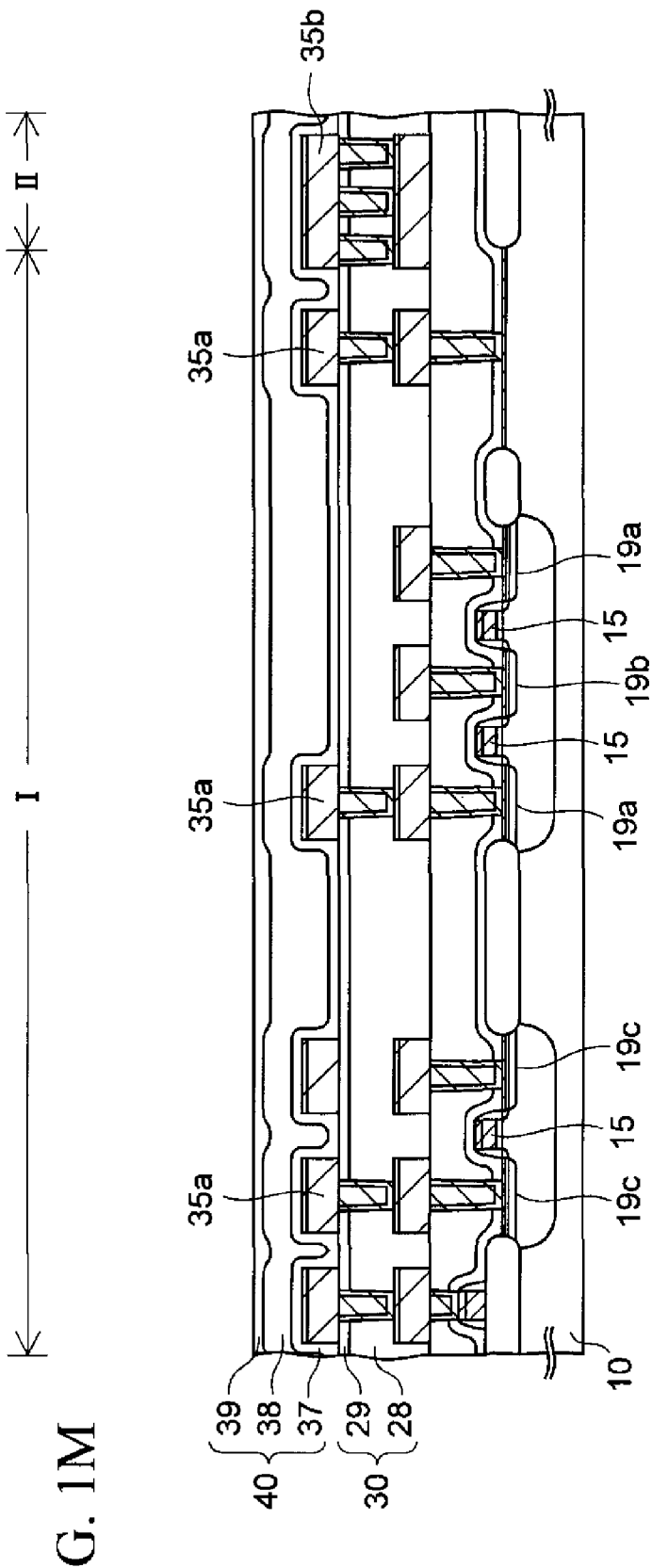
Figure 10:
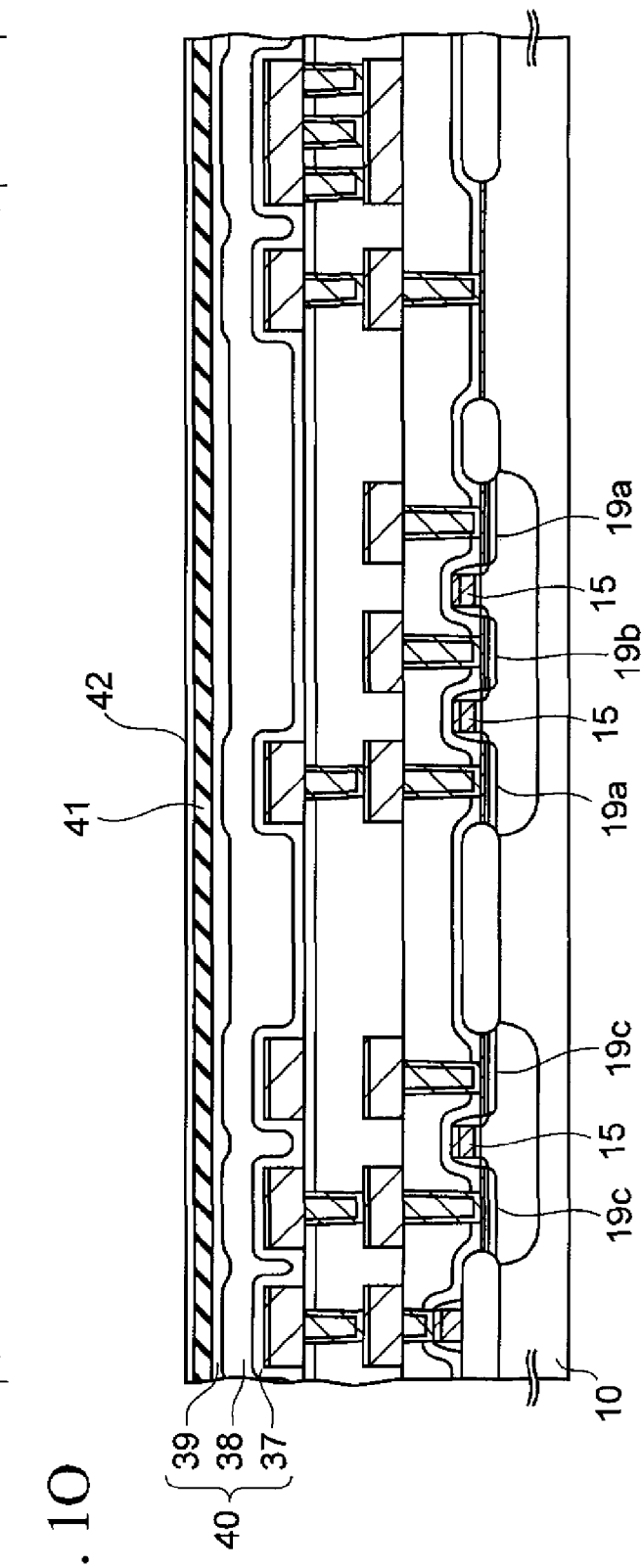
Figure 1P:
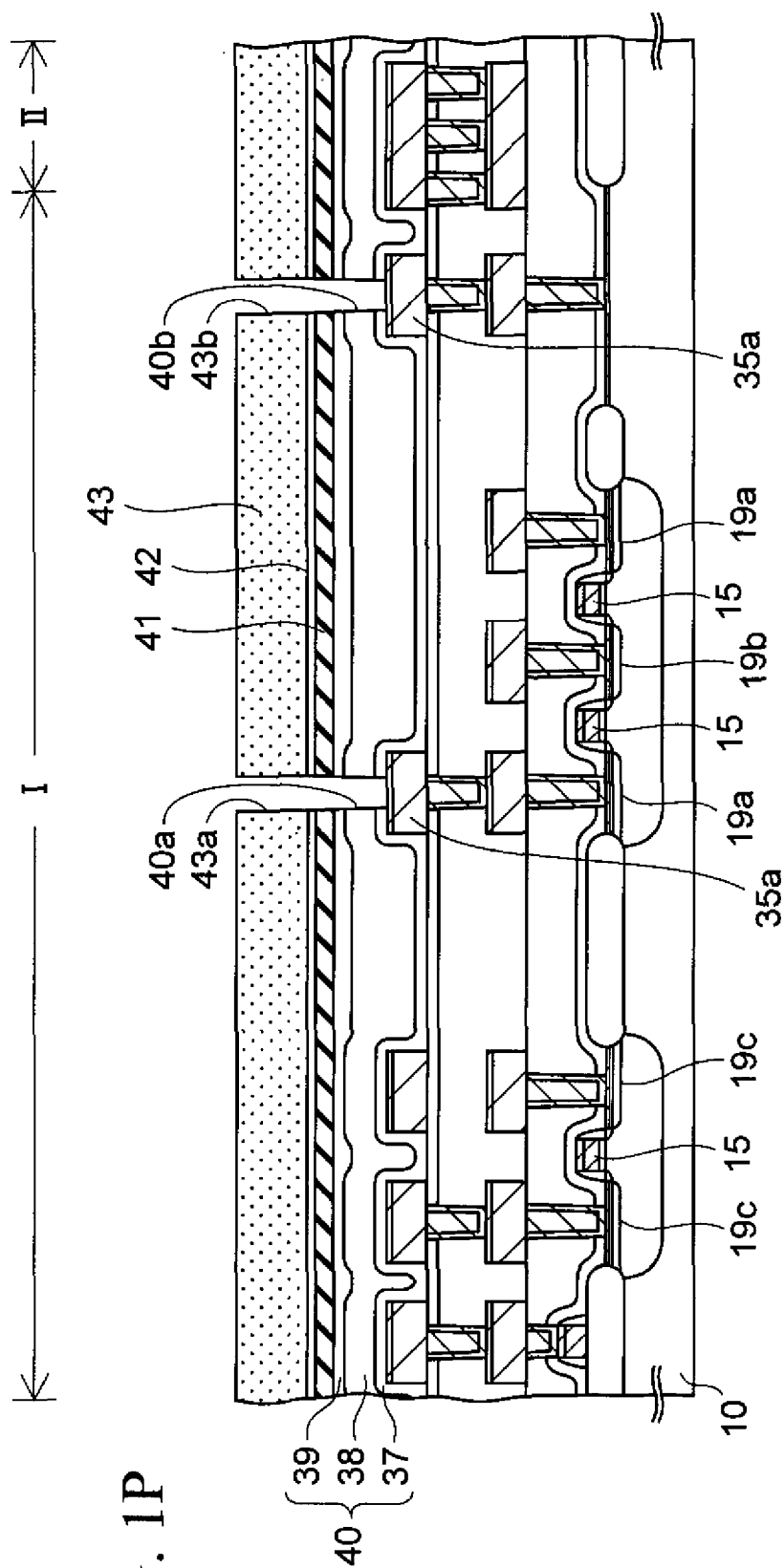
Figure 1Q:
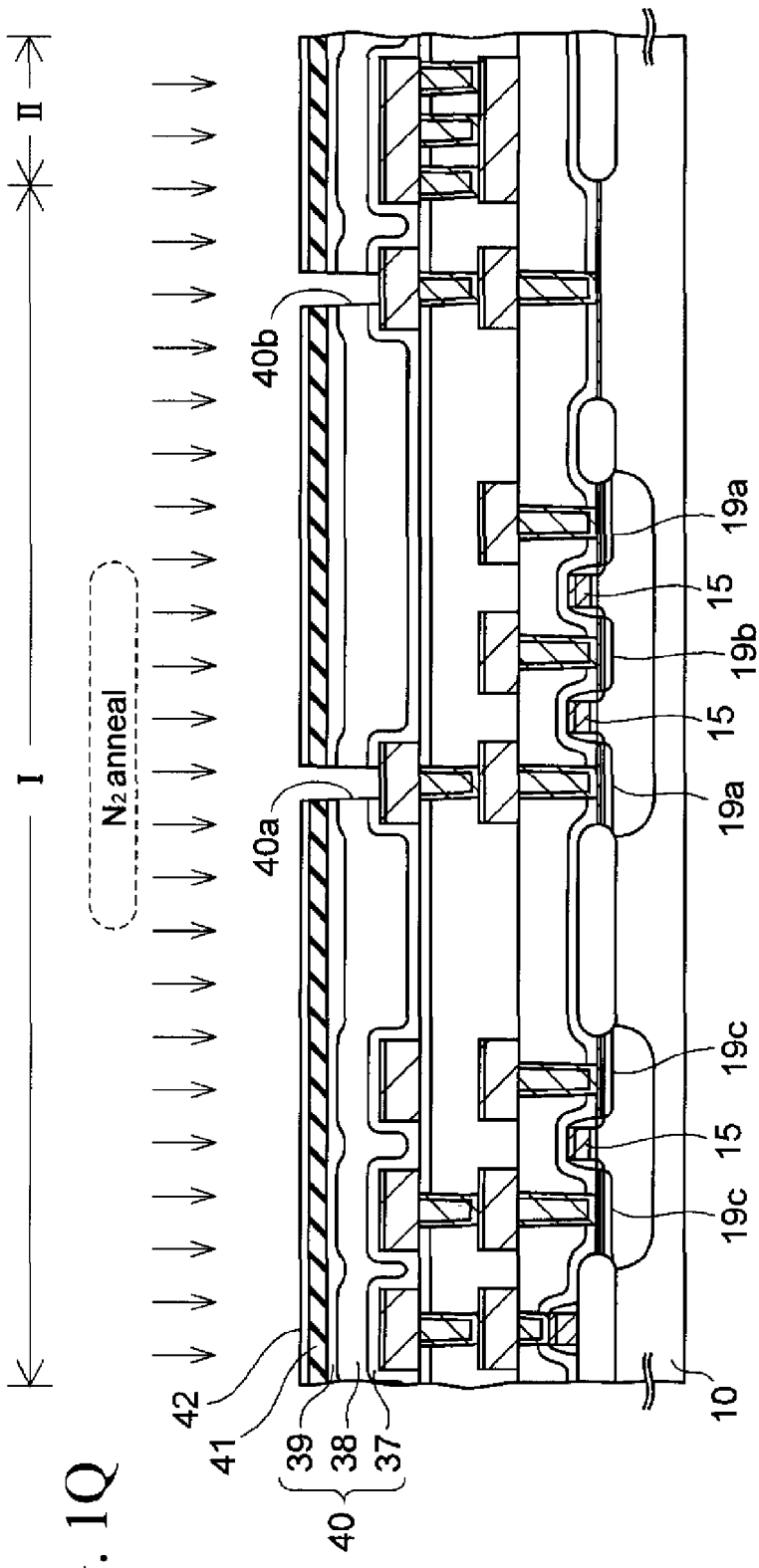
Figure 1R:
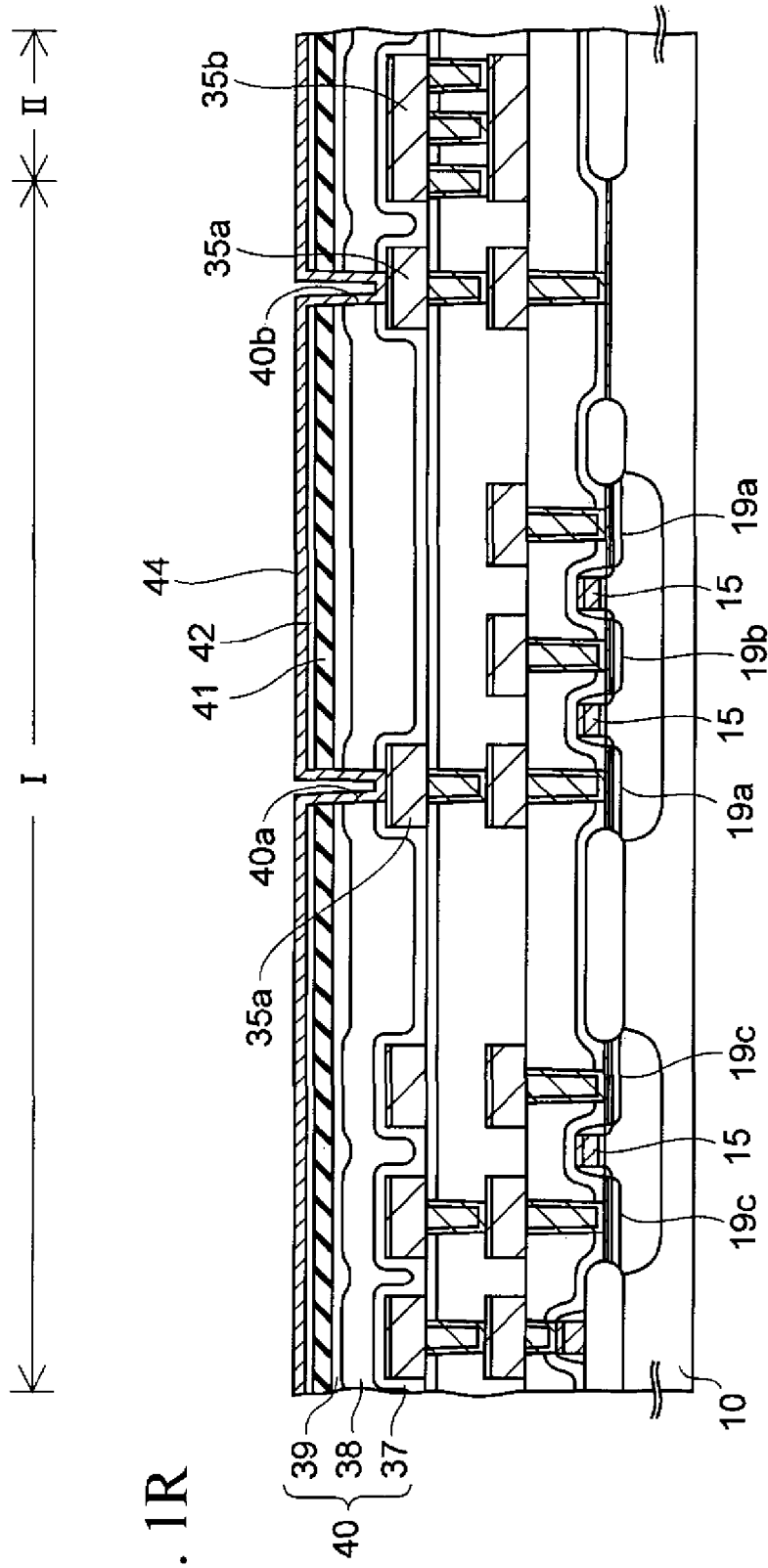
Figure 1S:
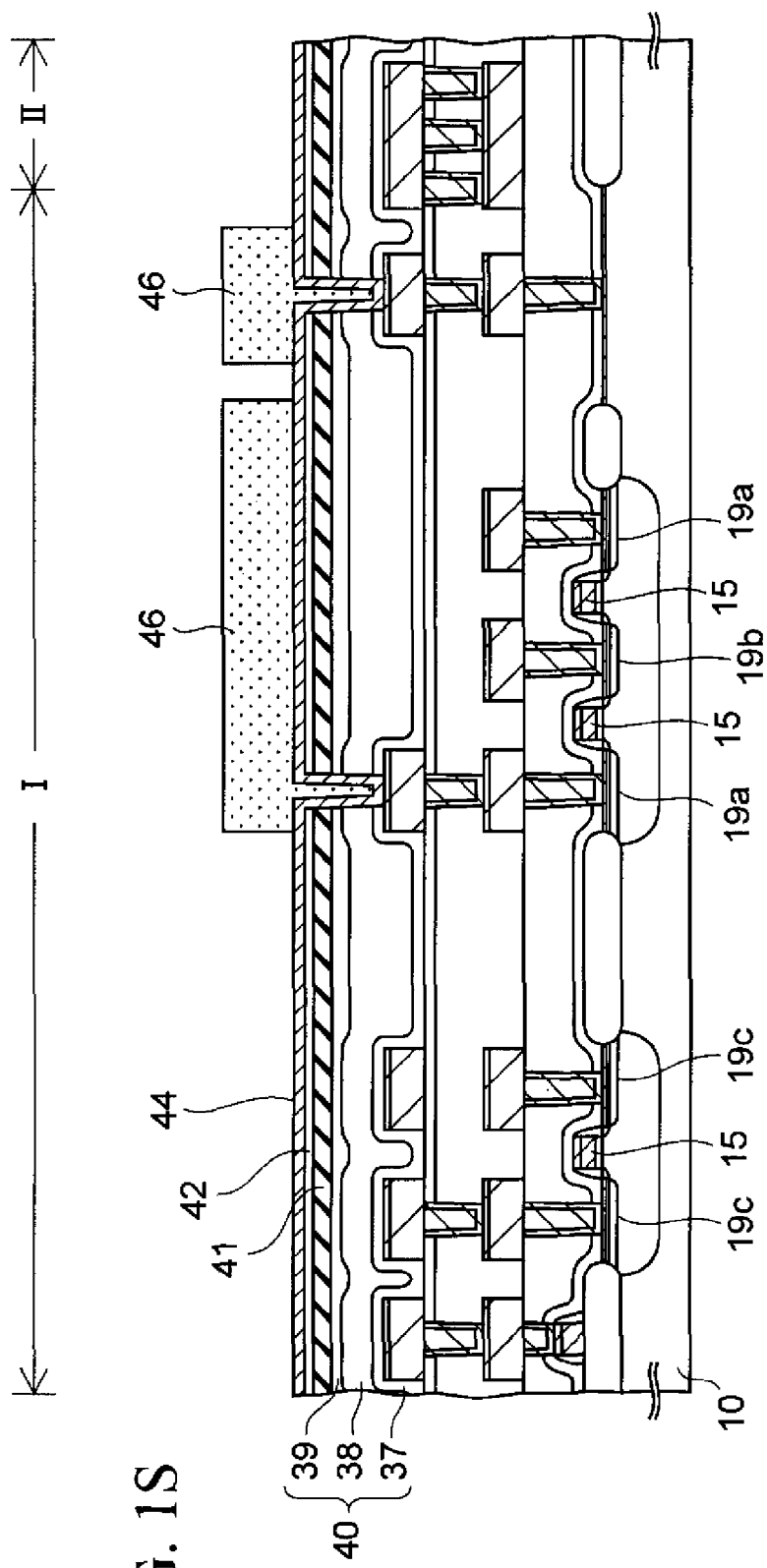
Figure 1V:
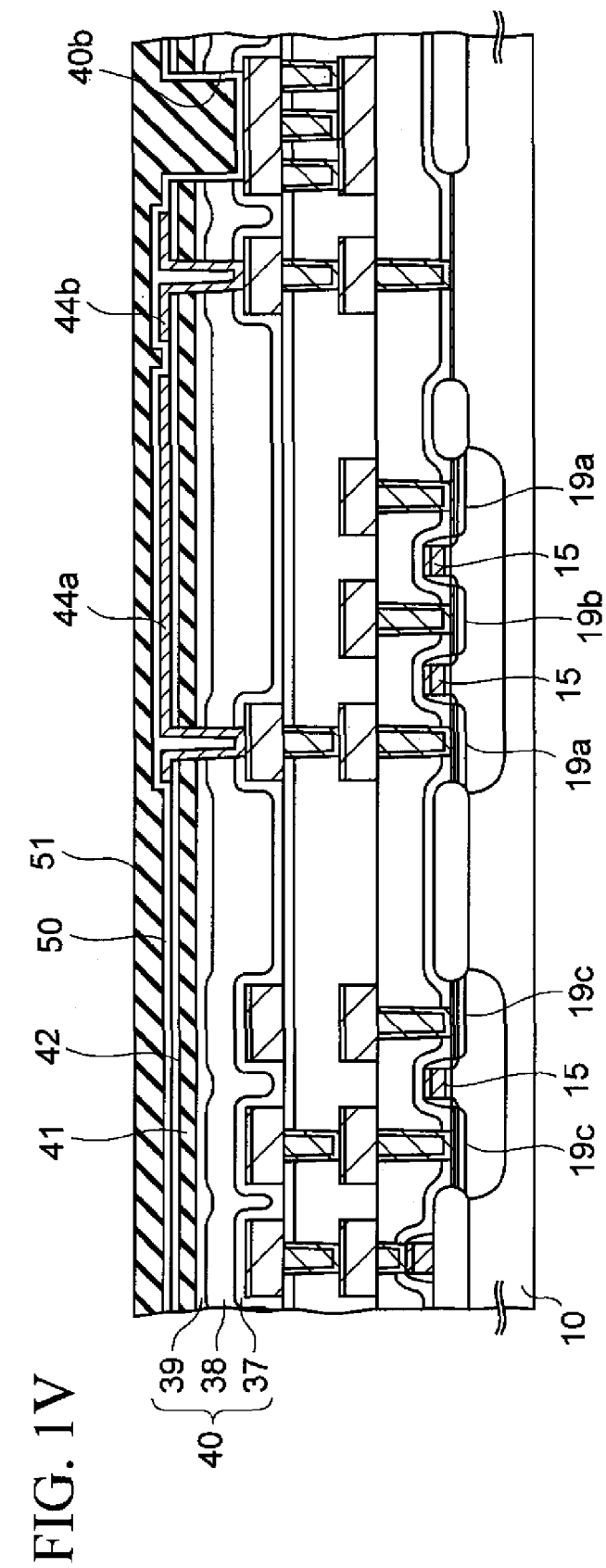
Figure 1W:
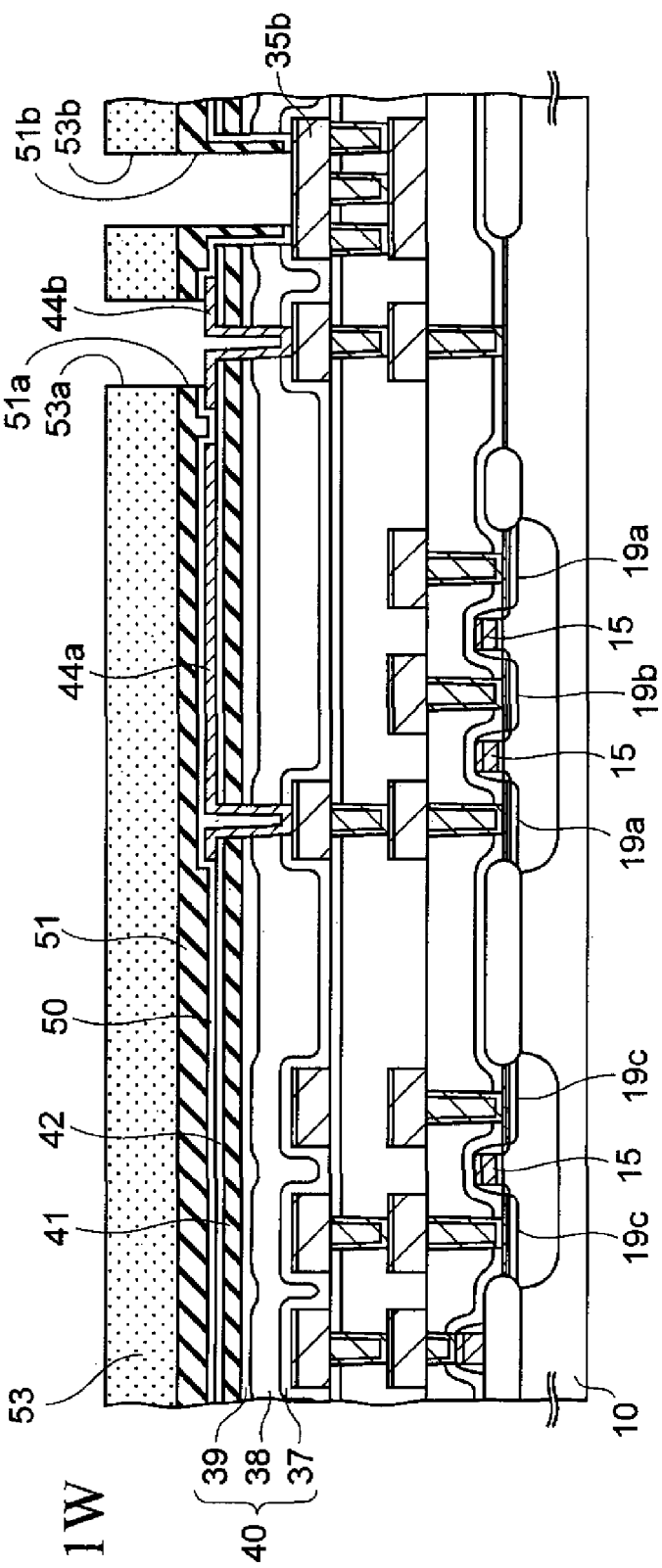
Figure 1X:
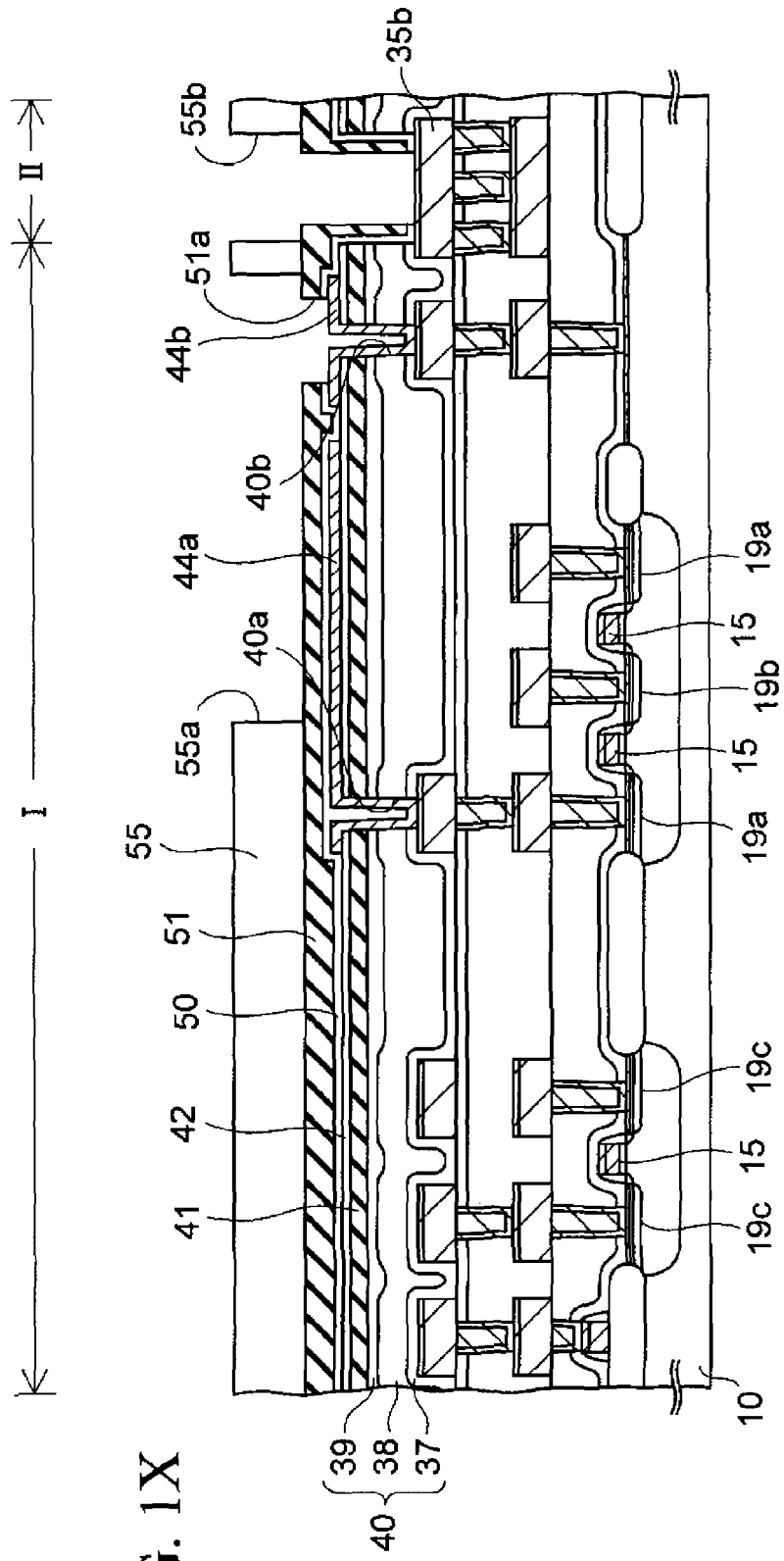

FIG. 1A to 1X are cross-sectional views each illustrating a surface-shape sensor in the process of manufacturing according to an embodiment. In these figures, a sensor region I used for recognizing a fingerprint is illustrated together with a pad region II to which a bonding wire joins at the time of packaging.

First, description is made for obtaining the cross sectional structure shown in FIG. 1A.

To begin with, a surface of an n type or a p type silicon (semiconductor) substrate 10 is thermally oxidized to form an device isolation insulating film 11. The device isolation insulating film 11 is used for defining an active region of a transistor. The height from the surface of the silicon substrate 10 to the upper surface of the device isolation insulating film 11 is approximately 100 nm. The device isolation structure of this kind is called LOCOS (Local Oxidation of Silicon), but STI (Shallow Trench Isolation) may be adopted instead.

Next, a p type impurity, such as boron, is introduced to the active region of the silicon substrate 10 to form a first p well 12 and a second p well 13. After that, the surface of the active region is thermally oxidized to form a thermally-oxidized film, which is to be a gate insulating film 14, is formed in a thickness approximately of 6 nm to 7 nm.

Subsequently, on the entire upper surface of the silicon substrate 10, a noncrystalline silicon film of an approximately 50 nm thickness, and a tungsten silicide film of an approximately 150 nm thickness are formed in this order. It should be noted that a polycrystalline silicon film may be formed in place of the noncrystalline silicon film. After that, these films are subjected to a patterning process by a photolithography method to form a gate electrode 15 on the silicon substrate 10 and a wiring 16 on the device isolation insulating film 16.

Moreover, by carrying out an ion-implantation using gate electrode 15 as a mask, phosphorous, as an n type impurity, is introduced to the silicon substrate 10 at the side of the gate electrode 15 to form a first to a third source/drain extensions 17a to 17c.

After that, on the entire upper surface of the silicon substrate 10, an insulating film is formed, and the insulating film is etched back to leave an insulating spacer 18 at the side of the gate electrode 15 and at the side of the wiring 16. As the insulating film, a silicon oxide film is formed, for example, by a CVD (Chemical Vapor Deposition) method.

Subsequently, using the insulating spacer 18 and the gate electrode 15 as masks, another ion-implantation is carried out. This time, an n type impurity such as arsenic is implanted into the silicon substrate 10 to form a first to a third source/drain regions 19a to 19c in the silicon substrate 10 on the side of the gate electrode 15.

Moreover, on the entire upper surface of the silicon substrate 10, a refractory metal film, such as a cobalt film, is formed by a sputtering method. Then, the refractory metal film is heated up to react with silicon to form a refractory metal silicide layer 20, such as a cobalt silicide layer, on a silicon substrate 10 in the first to the third source/drain regions 19a to 19c. Accordingly, each of the source/drain regions 19a to 19c is made to have a lower resistance.

It should be noted that the refractory metal silicide layer 20 is also formed in the surface layer of a portion of the silicon substrate 10 where no device isolation insulating film 11 is formed.

After that, unreacted refractory metal left on the device isolation insulating film 11 is removed by a wet etching method.

In the step thus far, a first to a third transistor $TR_1$ to $TR_3$ including the gate insulating film 14, the gate electrode 15, and the first to the third source/drain region 19a to 19c are formed in the active region of the silicon substrate 10.

Next, as shown in FIG. 1B, on the entire upper surface of the silicon substrate 10, a silicon-oxynitride (SiON) film is formed in a thickness of approximately 200 nm by a plasma CVD method. The silicon-oxynitride film thus formed is made to be a cover insulating film 21.

Subsequently, on the cover insulating film 21, a silicon oxide film is formed, as a first insulating film 22, in a thickness of approximately 1000 nm, by a plasma CVD method using TEOS (tetra ethoxy silane) gas. After that, the first insulating film 22 is polished by a CMP (Chemical Mechanical Polishing) method by approximately 200 nm to planarize the upper surface of the first insulating film 22.

In this embodiment, the cover insulating film 21 and the first insulating film 22, formed in this way, constitute a first interlayer insulating film 23.

Subsequently, as shown in FIG. 1C, a photoresist is applied onto the first interlayer insulating film 23. Then, the first interlayer insulating film 23 is subjected to an exposure and a development to form a first resist pattern 24 with windows 24a to 24e.

Subsequently, the first interlayer insulating film 23 is dry-etched while using the first resist pattern 24 as a mask to form a first to a fifth contact-holes 23a to 23e as shown in FIG. 1C. After that, the first resist pattern 24 is removed.

Next, the description is made for obtaining the cross sectional structure shown in FIG. 1D.

First, inside the first to the fifth contact-holes 23a to 23e and on the first interlayer insulating film 23, a titanium (Ti) film of an approximately 20 nm thickness and a titanium nitride (TiN) film of an approximately 50 nm thickness is formed, as a glue film, in this order by a sputtering method.

Next, on the glue film, a tungsten film is formed by a CVD method. With this tungsten film, the first to the fifth contact-holes 23a to 23e are filled up completely.

Then, excess portions of the glue film and of the tungsten film on the first interlayer insulating film 23 are polished by a CMP method, and thus these films inside the first to the fifth contact-holes 23a to 23e are left as a first to a fifth conductive plugs 25a to 25e.

Subsequently, as shown in FIG. 1E, on the upper surfaces of the first to the fifth conductive plugs 25a to 25e and of the first interlayer insulating film 23, a first metal-layered film 26 is formed. The metal-layered film is formed by a sputtering method, and is composed of a copper-containing aluminum film of an approximately 500 nm thickness, a titanium film of an approximately 5 nm thickness, and a titanium nitride film of an approximately 150 nm thickness, formed in this order from the bottom.

After that, a photoresist is applied onto the first metal-layered film 26. The first metal-layered film 26 is then subjected to an exposure and a development to be a second resist pattern 27.

Next, as shown in FIG. 1F, the first metal-layered film 26 is dry-etched while using the second resist pattern 27 as a mask to form first-layer metal wirings 26a. When the dry-etching is finished, the second resist pattern 27 is removed.

Next, description is made for obtaining the cross sectional structure shown in FIG. 1G.

First, on the entire upper surface of the silicon substrate 10, a silicon oxide film is formed in a thickness of approximately 2200 nm by a plasma CVD method using TEOS gas. This silicon oxide film is made to be a second insulating film 28.

Though not specifically shown in FIG. 1G, in the second insulating film 28 formed by use of TEOS gas, voids tend to be formed between adjacent first-layer metal wirings 26a. When the voids thus formed are left as they are, moisture or impurities are apt to remain inside the voids. This allows a stress migration to occur easily in the wirings 26a.

For this reason, after the formation of this second insulating film 28, the upper surface of the second insulating film 28 is polished by a CMP method to expose the voids on the surface of the second insulating film 28. Typically, the amount of polishing in this CMP is approximately 1000 nm.

After that, on the upper surface of the second insulating film 28, a silicon oxide film is formed as a first cap insulating film 29 by another plasma CVD method using TEOS gas. The voids are filled with this cap insulating film 29 completely.

The first cap insulating film 29 and the second insulating film 28 located therebeneath constitute together a second interlayer insulating film (base insulating film) 30.

Then, as shown in FIG. 1H, on the second interlayer insulating film 30, a third resist pattern 32 is formed. Then, through windows 32a of the third resist pattern 32, the second interlayer insulating film 30 is dry-etched to form first holes 30a with a depth reaching the first-layer metal wirings 26a.

After that, the third resist pattern 32 is removed.

Next, description is made for obtaining the cross sectional structure shown in FIG. 1I.

First, on the inner surface of each first hole 32a and on the upper surface of the second interlayer insulating film 30, a titanium nitride film is formed in an approximately 50 nm thickness as a glue film by a sputtering method.

Next, on the glue film, a tungsten film is formed in an approximately 700 nm thickness by a CVD method. With this tungsten film, the first holes 30a are filled completely.

Then, the portions of the glue film and of the tungsten film on the second interlayer insulating film 30 are polished by a CMP method, and thus these films inside the first holes 30a are left as a sixth conductive plugs 34.

Thereafter, as shown in FIG. 1J, on the second interlayer insulating film 30 and on the sixth conductive plugs 34, a copper-containing aluminum film and a titanium nitride film are formed in this order by a sputtering method and these films are made to be a second metal-layered film 35. It should be noted that there is no particular limitation on the thickness of the second metal-layered film 35, but that the copper-containing aluminum film and the titanium nitride film are, approximately, 500 nm and 120 nm thick, respectively.

After that, on the second metal-layered film, a fourth resist pattern 36 is formed.

Next, as shown in FIG. 1K, the second metal-layered film 35 is dry-etched while using the fourth resist pattern 36 as a mask. The second metal-layered film 35 that is left not etched is made to be second-layer metal wirings 35a and a bonding pad 35b.

After that, the fourth resist pattern 36 is removed.

Next, description is made for obtaining the cross sectional structure shown in FIG. 1L.

First, on each of the second-layered metal wirings 35a and on the second interlayer insulating film 30, a silicon oxide film is formed in an approximately 400 nm thickness by a plasma CVD method using TEOS gas. This silicon oxide film is made to be a cover insulating film 37.

The surface of this cover insulating film 37 has an unevenness that reflects the second-layered metal wirings 35a. Then, in the next step, to fill the unevenness, a silicon oxide film is formed as a third insulating film 38 on the cover insulating film 37.

In this embodiment, as a method of forming the third insulating film 38, an SOG (Spin On Glass) method is adopted for its excellence in filling-in operation. The thickness of the third insulating film 38 on a flat surface of the cover insulating film 37 is made to be approximately 500 nm.

After that, on this third insulating film 38, a silicon oxide film is formed in an approximately 2000 nm thickness as a sacrifice insulating layer 39 by a plasma CVD method using TEOS gas.

The insulating films 37 to 39 thus formed constitute a third interlayer insulating film 40.

Even though the third insulating film 38 is formed, as described above, by the SOG method, which is excellent in filling-in operation, the surface of the third interlayer insulating film 40 has a slight unevenness that reflects the second-layered metal wirings 35a.

Next, as shown in FIG. 1M, the upper surface of the sacrifice insulating film 39 is polished to be planarized by a CMP method. Typically, the amount of polishing in this CMP is approximately 1000 nm.

Thereafter, as shown in FIG. 1N, for the purpose of removing the moisture taken into the third interlayer insulating film when forming the insulating film 37 to 39 and when carrying out the CMP shown in FIG. 1M, the third interlayer insulating film 40 is annealed and dehydrated in a nitrogen containing atmosphere, such as in a $N_2O$ plasma atmosphere. By such annealing, the surface of the third interlayer insulating film 40 is nitrided, and reabsorption of the moisture in the third interlayer insulating film 40 is prevented.

There is no particular limitation on the condition under which the $N_2O$ plasma annealing is carried out. In this embodiment, a CVD apparatus substitutes for the annealing apparatus, and this $N_2O$ plasma annealing is carried out under a substrate temperature of 350° C., for a processing time of 2 to 4 minutes. It should be noted that a high-frequency electric power of a 13.56-MHz frequency and of 500-W power is applied to the CVD apparatus, as an electric power for creating plasma.

This $N_2O$ plasma annealing is especially effective in the case where the third insulating film 38 is formed by an SOG method, because much moisture may possibly be contained in films formed in this method.

Incidentally, in spite of the dehydration of the third interlayer insulating film 40 described above, external moisture sometimes intrudes into the third interlayer insulating film 40 when the third interlayer insulating film 40 is used in practice. In such a case, for example, water touches the first-layered metal wirings 26a and the second-layered metal wirings 35a each in a state of producing heat with the circuit activated. As a result, stress migration occurs in these wirings, and, in the worst case, inconveniences such as a breaking-out of the wirings may occur.

Therefore, in the next step, as shown in FIG. 1O, for the purpose of preventing the intrusion of external moisture, a first moisture-barrier insulating film 41 is formed on the third interlayer insulating film 40.

When the third interlayer insulating film 40 is left in the air for a long time after the $N_2O$ plasma annealing described above is finished, moisture is re-adsorbed to the third interlayer insulating film 40. For this reason, it is preferable to form the first moisture-barrier insulation film 41 within twelve hours after the $N_2O$ plasma annealing is finished.

A silicon-nitride film or a silicon-oxynitride film, each formed by a plasma CVD method, can be adopted as the first moisture-barrier insulation film 41.

Among them, the silicon-nitride film is formed at a deposition temperature of 400° C. by a plasma CVD method using a mixture gas of silane ($SiH_4$) and ammonia ($NH_3$) as a reaction gas. On the other hand, the silicon-oxynitride film is formed at a deposition temperature of 400° C. by a plasma CVD method using a mixture gas of silane and $N_2O$ as a reaction gas.

The first moisture-barrier insulation film 41 is formed in the middle of the layered films constituting the surface-shape sensor. Accordingly, when a film with a strong stress is formed as the first moisture-barrier insulation film 41, a sloughing of film may possibly occur in the above-mentioned layered films. For this reason, in view of the prevention of the sloughing of film, it is preferable to form, as first moisture-barrier insulation film 41, the silicon-oxynitride film which has a smaller film stress than that of the silicon-nitride film.

Incidentally, descriptions will be given later as to the thickness of the first moisture-barrier insulating film 41 constituted by the silicon-nitride film, and the thickness of insulating film 41 constituted by the silicon-oxynitride film.

Alternatively, an insulating metal-oxide film, such as an alumina (aluminum oxide) film and a titanium oxide film, may be formed as the first moisture-barrier insulating film 41. These insulating metal-oxide films can be formed by a sputtering method.

The insulating metal-oxide films are more excellent in moisture-barrier property than the silicon-nitride film and the silicon-oxynitride film. Accordingly, the thickness of the first moisture-barrier insulating film 41 of an insulating metal-oxide film can be reduced to approximately 20 nm to 100 nm. Lower limit of the film thickness is set to 20 nm, since the first moisture-barrier insulating film 41 with less than 20 nm shows poor moisture-barrier property.

It should be noted that the above-mentioned value is only applicable to a case where the first moisture-barrier insulating film 41 is formed on the third interlayer insulating film 40 that has been planarized as in this embodiment. The insulating metal-oxide film formed by a sputtering method has a poor coverage property. Accordingly, when the third interlayer insulating film 40 is not planarized, it is preferable to form the first moisture-barrier insulating film 41 in a 50 nm thickness.

On the other hand, the insulating metal-oxide films are difficult to be etched by a chemical reaction. Accordingly, in view of making the etching of the first moisture-barrier insulating film 41 in the following steps easier, it is preferable to set the upper limit of the thickness of the first moisture-barrier insulating film 41 at 100 nm and not to form the first moisture-barrier insulating film 41 in a thickness beyond this value.

In addition, examples of such an insulating metal-oxide film include, beside the above-mentioned alumina film and the titanium oxide film, a zirconium oxide ($ZrO_x$) film, a magnesium oxide ($MgO_x$) film and a magnesium titanium oxide ($MgTiO_x$) film.

After the first moisture-barrier insulating film 41 is formed in this way, a silicon oxide film is formed, as a second cap insulating film 42, in a 50 nm to 100 nm thickness, by a plasma CVD method using TEOS gas, on the entire upper surface of the silicon substrate 10.

Next, description is made for obtaining the cross-sectional structure shown in FIG. 1P.

First, on the second cap insulating film 42, a fifth resist pattern 43 is formed.

Next, each of the insulating films 40 to 42 is dry-etched, through windows 43a and 43b of the fifth resist pattern 43, to form a second and a third holes 40a and 40b in these insulating films on the second-layered metal wirings 35a.

The conditions under which this etching is carried out vary in accordance with the material of the first moisture-barrier insulating film 41.

For example, in the case where a silicon-nitride film or a silicon-oxynitride film is formed as the first moisture-barrier insulating film 41, a mixture gas of $CF_4$ (flow rate: 159 sccm), $C_4F_8$ (flow rate: 188 sccm) and Ar (flow rate: 429 sccm) is used as an etching gas. In this case, the high-frequency electric power (frequency: 13.56 MHz) applied to the etching atmosphere is 1000 W, and the etching time is six minutes.

It should be noted that the etching under the conditions described above may be carried out as a second etching step, following a first etching step using a $CHF_3$-based gas.

On the other hand, in the case where an insulating metal-oxide film is formed as the first moisture-barrier insulating film 41, a mixture gas of $C_4F_8$ (flow rate: 20 sccm), Ar (flow rate: 500 sccm) and $O_2$ (flow rate: 12 sccm) is used as the etching gas. In this case, the high-frequency electric power of 27.12-MHz frequency is 2000 W, and the high-frequency electric power of 800-kHz frequency is 900 W.

The insulating metal-oxide films are more excellent in moisture-barrier property than the silicon-nitride film and the silicon-oxynitride film. Accordingly, the first moisture-barrier insulating film 41 made of the insulating metal-oxide film can be made thinner than in the case of using these silicon nitride or silicon-oxynitride films for the first moisture-barrier insulating film 41. By thinning the first moisture-barrier insulating film 41 made of the material that is more difficult to be etched than the third interlayer insulating film 41, the second and the third holes 40a and 40b can be formed in favorable states by etching in this step.

After that, the fifth resist pattern 43 is removed.

Subsequently, as shown in FIG. 1Q, the third interlayer insulating film 40 is annealed in a $N_2$ atmosphere. Thus, the moisture still contained in the third interlayer insulating film 40 is let out through the holes 40a and 40b.

This $N_2$ annealing is carried out under the conditions of a substrate temperature of 350° C., a 20 litter/min $N_2$ flow rate and a 30 minute processing time.

Next, as shown in FIG. 1R, on the second cap insulating film 42 and inside the second and the third holes 40a and 40b, a titanium nitride film is formed, as a conductive film 44, in an approximately 200 nm thickness by a sputtering method.

The conductive film 44 is not limited to the titanium nitride film. Titanium film, or an aluminum titanium nitride film may be formed as the conductive film 44. As will be described later, the conductive film 44 is made to be a detection-electrode film to which a finger comes close. The conductive film 44 made of a material containing titanium as described above can make the detection-electrode film highly resistant to corrosion.

Alternatively, the conductive film 44 made of noble metals such as Au, Ag, Pt, Pd, Rh, Ir, Ru and Os also makes the detection-electrode film highly resistant to corrosion.

It should be noted that the moisture contained in the third interlayer insulating film 40 is made to let out thorough the holes 40a and 40b sufficiently in the step of FIG. 1Q preceding the formation of the conductive film 44. Accordingly, the degassing from the holes 40a and 40b at the time of the formation of the conductive film 44 is reduced. Thus, the conductive film 44 is prevented from being not formed in the holes 40a and 40b.

Note also that when the conductive film 44 is formed a long time after the annealing step of FIG. 1Q, moisture is absorbed in the holes 40a and 40b, so that the conductive film 44 may not be formed in these holes 40a and 40b. For this reason, it is preferable to form the conductive film 44 within an hour after the above-mentioned annealing step is carried out.

Moreover, the third interlayer insulating film 40 is dehydrated also in the step of FIG. 1N. As a result, even when the third interlayer insulating film 40 is heated at the time of the formation of the conductive film 44, the second-layered metal wirings 35a can be prevented from being steamed by the moisture that might have been enclosed in the third interlayer insulating film 40 by the first moisture-barrier insulating film 41.

Next, as shown in FIG. 1S, a photoresist is applied onto the conductive film 44. Then, the photoresist is subjected to an exposure and a development to form a sixth resist pattern 46.

Subsequently, as shown in FIG. 1T, the conductive film 44 is dry-etched while using the sixth resist pattern 46 as a mask. The conductive film 44 is left only inside and around the second and the third holes 40a and 40b as a detection-electrode film 44a and a ground electrode 44b, respectively.

The electrode films 44a and 44b are independent of each other, and are electrically connected to the second-layered metal wiring 35a through the second and the third holes 40a and 40b, respectively. Furthermore, the ground electrode 44b is electrically connected to the silicon substrate 10 at the ground potential.

Incidentally, in this step, for the purpose of not leaving any etching residue of the conductive film 44, an overetching is carried out. In other words, the amount of etching is larger than the thickness of the conductive film 44. Even when such overetching is carried out, the second cap insulating film 42 absorbs the etching. Accordingly, the etching cannot reach the first moisture-barrier insulating film 41. As a result, the first moisture-barrier insulating film 41 is prevented from being made thinner by the etching, and can remain highly capable of blocking moisture.

After that, the sixth resist pattern 46 is removed.

Next, as shown in FIG. 1U, on the entire upper surface of the silicon substrate 10, a seventh resist pattern 48 is formed.

Then, each of the insulating films 40 to 42 are etched through windows 48a of the seventh resist pattern 48 to form an electrode-leading window 48b on the bonding pad 35b.

After the etching is finished, the seventh resist pattern 48 is removed.

Subsequently, as shown in FIG. 1V, on the third interlayer insulating film 40 as well as on the electrode films 44a and 44b, a silicon oxide film is formed in an approximately 100 nm thickness as a cover insulating film 50. The cover insulating film 50 is formed by, for example, a plasma CVD method using TEOS gas.

Incidentally, the first moisture-barrier insulating film 41 has already been formed as a film for blocking the intrusion of moisture. However, for the purpose of blocking the intrusion of moisture more securely, it is necessary to form another moisture-barrier insulating film in a portion closer to the outside air.

Therefore, in the next step, on the cover insulating film 50, a silicon-nitride film is formed, by a plasma CVD method, as a second moisture-barrier insulating film 51. The film-forming gas used for the silicon-nitride film is a mixture gas of ammonia and silane. The deposition temperature is 400° C. A high-frequency electric power (frequency: 13.56 MHz; power: 600 W) and another high-frequency electric power (frequency: 400 kHz; power: 200 W) are applied to the deposition atmosphere. The silicon-nitride film thus formed has a refractivity of approximately 1.98.

This second moisture-barrier insulating film 51 is formed in a portion closer to the outside air than the first moisture-barrier insulating film 41. Therefore, the priority needs to be placed on the moisture-barrier capability over the reduction in film stress for the second moisture-barrier insulating film 51. For this purpose, the present embodiment employs silicon nitride, which is superior to silicon oxynitride in the moisture-barrier capability, as the material for the second moisture-barrier insulating film 51.

Even though the silicon nitride film with relatively larger stress is formed as the second moisture-barrier insulating film 51, the cover insulating film 50 made of silicon oxide plays the role of reducing the stress, so that film sloughing due to the second moisture-barrier insulating film 51 is prevented.

In this embodiment, the first moisture-barrier insulating film 41 works together with the second moisture-barrier insulating film 51 for the purpose of blocking the intrusion of moisture, and the moisture-barrier capability depends on the total film thickness of these two insulating films 41 and 51. The total film thickness will be described later.

Next, as shown in FIG. 1W, a photoresist is applied onto the second moisture-barrier insulating film 51. Then, the photoresist is subjected to an exposure and a development to form an eighth resist pattern 53.

Then, each of the cover insulating film 50 and the second moisture-barrier insulating film 51 are dry-etched through windows 53a and 53b of the eighth resist pattern 53.

In this way, a first opening 51a is formed in the second moisture-barrier insulating film 51 on the ground electrode film 44b, and the ground electrode film 44b is exposed through the first opening 51a. This first opening 51a is also called an ESD (Electro Static Discharge) hole.

Meanwhile, in the pad region II, a second opening 51b through which the bonding pad 35b is exposed is formed.

Then, after the eighth resist pattern 53 is removed, a dehydration process is carried out in a $N_2$ atmosphere at a substrate temperature of 430° C. for 30 minutes.

Next, description is made for obtaining the cross-sectional structure shown in FIG. 1X.

First, an application film made of a non-photosensitive polyimide is applied onto the second moisture-barrier insulating film 51 in an approximately 200 nm thickness. After that, the application film is subjected to a baking process.

Next, a resist pattern (not illustrated) is formed on the application film. Using this resist pattern as a mask, the application film is etched by an etching solution for polyimide to form a protection insulating film 55, which is the uppermost layer, with a first and a second windows 55a and 55b. The protection insulating film 55 functions as a buffer material to protect the circuit from physical impacts.

Moreover, after the resist pattern is removed by a rinse solution, the protection insulating film 55 is cured at a substrate temperature of 350° C. and at a $N_2$ flow rate of 18 litters/min, and thus the protection insulating film 55 is hardened It should be noted that, at the time of curing, impurities may sometimes adhere to the surface of the protection insulating film 55. For the purpose of removing the impurities, the upper surface of the protection insulating film 55 is scraped by approximately 200 nm by a plasma ashing method. By carrying out such a plasma ashing, the protection insulating film 55 has an ultimate thickness of approximately 800 nm.

When the thickness of the protection insulating film 55 is lower than 800 nm, strength of the film 55 is reduced, and it is difficult for the film 55 to play as a buffer material. Accordingly, the minimum necessary thickness is 800 nm for the protection insulating film 55.

Here, it may be possible to form the protection insulating film 55 not with the non-photosensitive polyimide but with a photosensitive polyimide. The photosensitive polyimide, however, contains a photosensitizing agent and a cross-linking agent. Therefore, the photosensitive polyimide is softer than the non-photosensitive polyimide, which causes such a problem that scratches are formed in the protection insulating film 55 if the protection insulating film 55 is made of photosensitive polyimide.

In contrast, the protection insulating film 55 of non-photosensitive polyimide such as one in this embodiment has a higher hardness than the protection insulating film 55 of photosensitive polyimide. As a result, while maintaining the hardness needed to protect the device, the protection insulating film 55 can be made thinner to the extreme.

Figure 2:
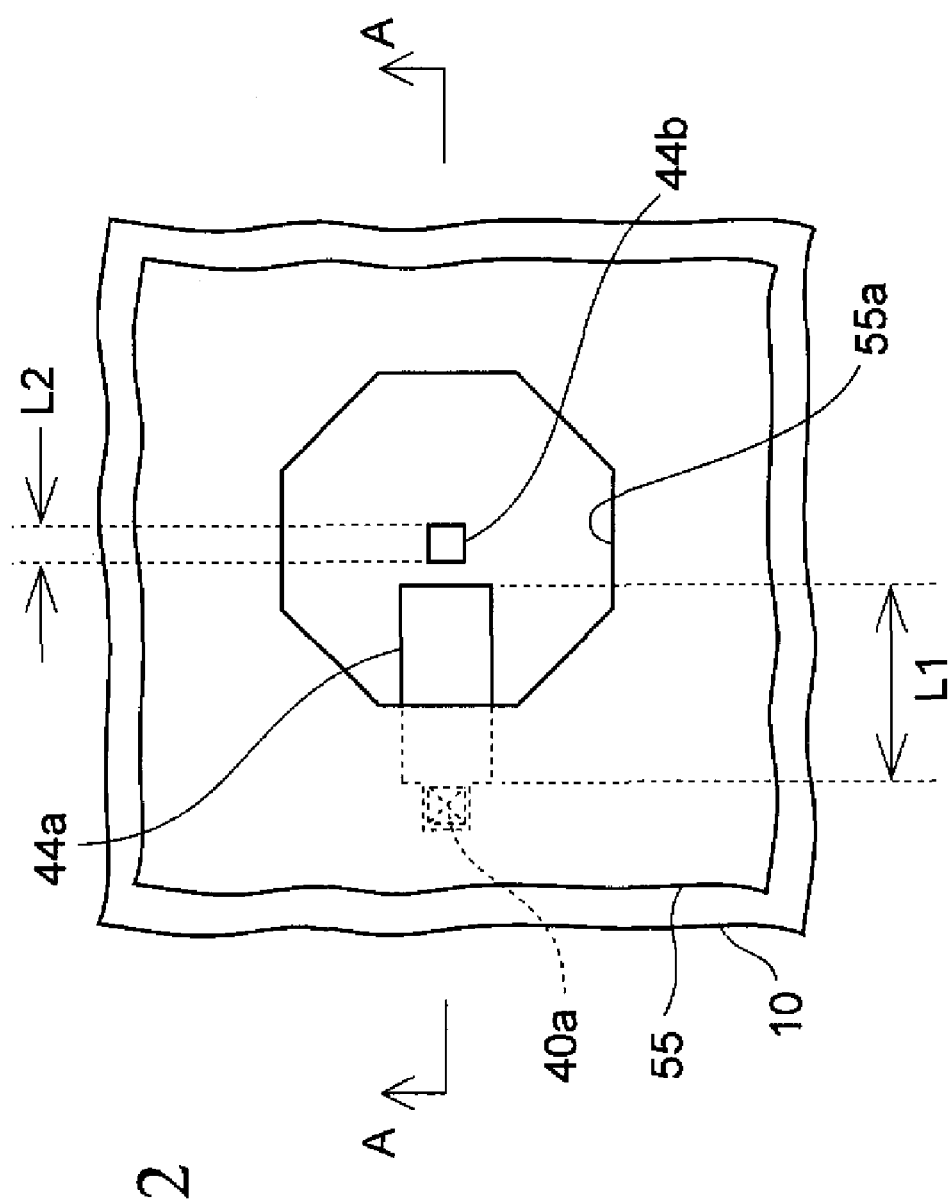
FIG. 2 is a plan view illustrating the surface-shape sensor according to the embodiment.

FIG. 2 is a plan view of the sensor region I in a state in which the above-mentioned step is finished. The above-described FIG. 1X corresponds to a cross-sectional view of the FIG. 2 taken along the line A-A. Though only one detection-electrode film 44a is illustrated in the FIG. 2, a plurality of detection-electrode films 44a are actually formed in a matrix (for example, 1024×1024 films), and each detection-electrode film functions as a picture element.

Though the planer size of the electrode films 44a and 44b is not limited, L1 is approximately 50 μm and L2 is approximately 6 μm as shown in FIG. 2 in the present embodiment.

As has been described thus far, the basic structure of the surface-shape sensor according to this embodiment is finished.

Figure 3:
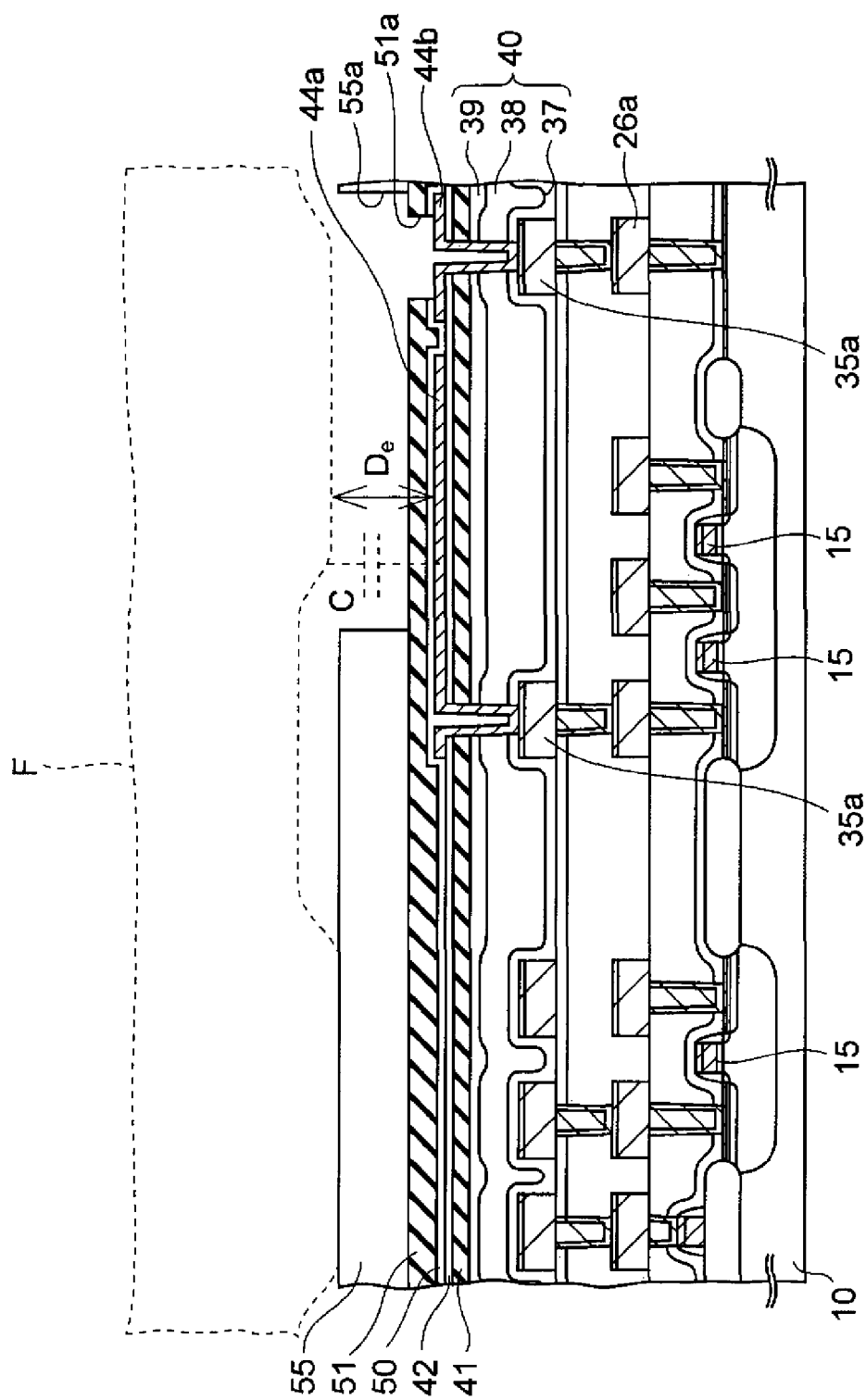
FIG. 3 is a cross-sectional view for describing an operation of the surface-shape sensor according to the embodiment.

FIG. 3 is a cross-sectional view for describing an operation of the surface-shape sensor. Note that the pad region II is omitted from FIG. 3.

As shown in FIG. 3, in this surface-shape sensor, when a finger (object to be examined) F touches the protection insulating film 55, a capacitor C is formed between the finger F and the detection-electrode film 44a. The capacitance of the capacitor C varies in accordance with the unevenness on the surface of the finger F (fingerprint). For this reason, an image of fingerprint is obtained by reading the difference in capacitance by detection-electrode film 44a.

Moreover, the static electricity stored on the finger 7 is discharged through the grounding electrode film 44b to the silicon substrate 10. Thus, the circuit formed on the silicon substrate 10 is prevented from being destroyed by static electricity.

Figure 4:
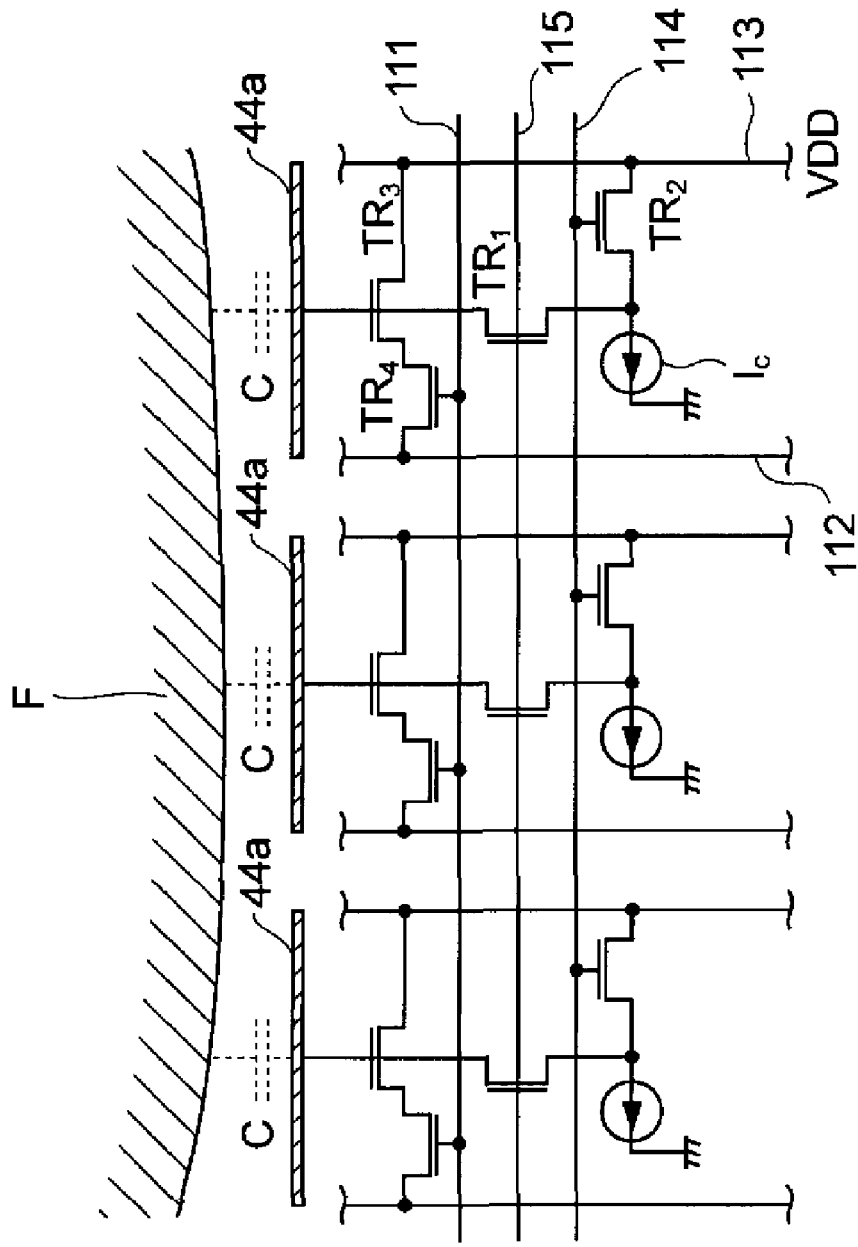
FIG. 4 is an equivalent circuit of the surface-shape sensor according to the embodiment.

FIG. 4 illustrates an equivalent circuit of this surface-shape sensor.

As shown in FIG. 4, this surface-shape sensor includes a fourth MOS transistor $TR_4$, in addition to the first to the third MOS transistors $TR_1$ to $TR_3$ shown in the FIG. 1A. To each of the transistors $TR_1$ to $TR_4$, a row drive line 111, a column sense line 112, a power source line 113, a reset line 114, a charge control line 115, and a charge current source Ic are connected as shown in the drawing. Thus, the surface-shape sensor is driven by what is called a current charging method.

Here, reference is made again to FIG. 3.

As shown in FIG. 3, the distance $D_e$ between the finger F and the detection-electrode film 44a is restricted by the second moisture-barrier insulating film 51 and the protection insulating film 55. As these films 51 and 55 are made thinner, the distance $D_e$ becomes narrower, and thus the capacitance of the capacitor C becomes larger.

The larger the capacitance of the capacitor C is, the higher the sensitivity in detecting fingerprints becomes. Therefore, it is preferable to make the second moisture-barrier insulating film 51 and the protection insulating film 55 as thin as possible. Among these, the protection insulating film 55 made of non-photosensitive polyimide is already formed thinner to the extreme extent that the protection insulating film 55 can barely prevent a pinhole from occurring. For this reason, there is no room for making the film 55 even thinner any longer.

Accordingly, for the purpose of improving the detection sensitivity, it is necessary to make the second moisture-barrier insulating film 51 thinner. However, an extremely thin second moisture-barrier insulating film 51 may possibly be incapable of blocking moisture.

In view of this, in this embodiment, the first moisture-barrier insulating film 41 is formed under the detection-electrode film 44a, so that the moisture barrier function is shared by both of the first and second moisture-barrier insulating films 41 and 51. With this structure, the moisture-blocking capability is compensated with the first moisture-barrier insulating film 41. Accordingly, while the moisture-blocking capability of these insulating films 41 and 51 as a whole is maintained, the second moisture-barrier insulating film 51 can be made thinner. As a result, the distance $D_e$ between the finger F and the detection-electrode film 44a can be made narrower, so that The capacitance of the capacitor C can be made larger to improve the detection sensitivity of fingerprints.

Here, for the purpose of making the above-mentioned distance $D_e$ as narrow as possible, it is preferable that the total thickness of the first and the second moisture-barrier insulating films 41 and 51 be set to the minimum thickness necessary for blocking the intrusion of moisture.

In the case where both of the first and the second moisture-barrier insulating films 41 and 51 are formed of silicon nitride films, the above-mentioned total thickness is not less than 500 nm.

Nevertheless, even when the total thickness is 500 nm or above, a thicker second moisture-barrier insulating films 51 prevents the narrowing of the distance $D_e$. Thus, the structure in which the moisture-barrier insulating film is divided into films 41 and 51 becomes less effective.

For this reason, regardless of the material that the first moisture-barrier insulating film 41 is made of, it is preferable to form the second moisture-barrier insulating film 51 made of silicon nitride in a thickness of not more than 500 nm.

For example, when the total thickness of the insulating films 41 and 51 is set at 500 nm, the thicknesses of the first and the second moisture-barrier insulating films 41 and 51 may be 400 nm and 100 nm, respectively.

On the other hand, in the case of the moisture-barrier insulating film made of silicon oxynitride, which is inferior to silicon nitride in moisture-barrier capability, the first moisture-barrier insulating film 41 is formed in a thickness 1.2 times as thick as the thickness of the first film 41 made of silicon nitride. For example, it is preferable that the first film 41 be formed in a thickness 1.2 times as thick as the value obtained by subtracting the thickness of the second moisture-barrier insulating film 51 from the 500 nm thickness. In this case, when the thickness of the second film 51 is 100 nm, the thickness of the first film 41 is 480 nm (=(500 nm−100 nm)× 1.2).

With the thicknesses of the first and the second moisture-barrier insulating films 41 and 51 being set at values such as those mentioned above, the above-mentioned distance $D_e$, that is, the distance between the upper surface of the detection-electrode film 44a and the upper surface of the protection insulating film 55, can be held down to not more than 1500 nm.

Here, it is conceivable that, without forming the second moisture-barrier insulating film 51, only the first moisture-barrier insulating film 41 might play the role of blocking moisture.

This structure, however, has an inconvenience. The cover insulating film 50 made of silicon oxide, which is more permeable to moisture than silicon nitride, absorbs moisture. The moisture thus absorbed generates stress migration in the metal wirings 26a and 35a. The second moisture-barrier insulating film 51 is essential also for avoiding such an inconvenience.

COMPARATIVE EXAMPLE

Next, comparative example of this embodiment will be explained.

Figure 5:
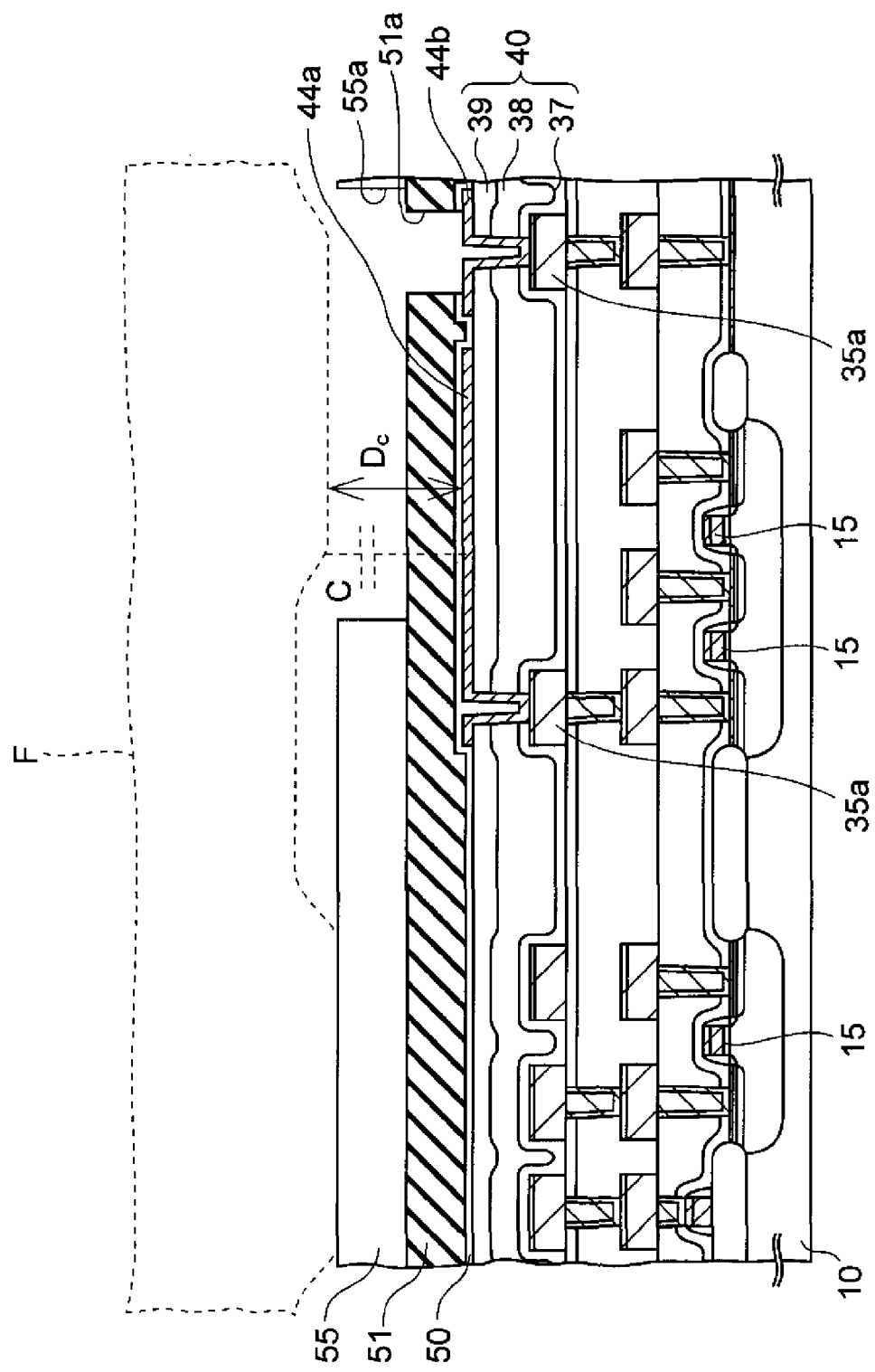
FIG. 5 is a cross-sectional view illustrating a surface-shape sensor according to a comparative example.

FIG. 5 is a cross-sectional view of a surface-shape sensor according to a comparative example.

In this embodiment described above, by forming the first moisture-barrier insulating film 41 in addition to the second moisture-barrier insulating film 51, the role of blocking moisture played by the second moisture-barrier insulating film 51 is reduced, and the second moisture-barrier insulating film 51 is made thinner.

In contrast, in this comparative example, first moisture-barrier insulating film 41 is not formed, but only the second moisture-barrier insulating film 51 is formed. Such a structure corresponds to the structure shown in Japanese Patent Application Laid-open Publication No. 2003-269907 and Japanese Patent Application Laid-open Publication No. 2003-172602.

Since no first moisture-barrier insulating film 41 is formed, the role of blocking moisture is concentrated on the second moisture-barrier insulating film 51. As a result, the second moisture-barrier insulating film 51 has to be made thicker than this embodiment for the purpose of securely blocking moisture. Typically, the necessary thickness for the second moisture-barrier insulating film 51 is approximately 700 nm.

As the second moisture-barrier insulating film 51 is formed thicker as described above, the distance $D_c$ between a finger F and a detection-electrode film 44a becomes wider. As a result, the capacitance of the capacitor C is reduced, and the detection sensitivity of fingerprints becomes lower.

FIGS. 6A and 6B are images of fingerprints obtained by the surface-shape sensor of Comparative Example, and FIG. 6C is an image obtained by the surface-shape sensor of this embodiment. Note that two images are obtained in the Comparative Example for $D_c$ with 2800 nm to 3000 nm and with 1600 nm to 1800 nm.

Then, the matching rate of fingerprint matching by use of these image data is examined. The matching rate is a proportion of being judged as the same person who tries to confirm his or her identity by a fingerprint authentication method. The higher the value of matching rate, the more accurate the fingerprint authentication is.

The matching rates for the two examples of Comparative Example are 30.3% and 56.3%. In contrast, a higher value, specifically, 87.9%, is obtained for this embodiment. This confirms the fact that the detection-sensitivity of fingerprint can actually be improved in this embodiment.

As has been described thus far, according to the present embodiment, a first moisture-barrier insulating film is formed besides a second moisture-barrier insulating film. Accordingly, the second moisture-barrier insulating film can be made thinner, the distance between the object to be examined and the detection-electrode film. As a result, a surface-shape sensor with high detection sensitivity can be provided.

What is claimed is:

1. A surface-shape sensor comprising:
   a semiconductor substrate;
   an interlayer insulating film formed over the semiconductor substrate;
   a first moisture-barrier insulating film formed on the interlayer insulating film;
   a cap insulating film formed on the first moisture-barrier insulating film;
   a first hole formed in the interlayer insulating film going through the cap insulating film and the first moisture-barrier insulating film;
   a second hole formed in the interlayer insulating film going through the cap insulating film and the first moisture-barrier insulating film, wherein the second hole couples electrically to the semiconductor substrate and the first hole couples to a source/drain region in the semiconductor substrate;
   a first detection-electrode film formed on the cap insulating film and inside and around the first hole;
   a second detection-electrode film formed on the cap insulating film and inside and around the second hole, wherein the first detection-electrode film and the second detection-electrode film are independent each other;
   a hollow formed on the cap insulating film between the first detection-electrode film and the second detection-electrode film;
   a cover insulating film formed inside and around the first hole and the hollow;
   a second moisture-barrier insulating film formed on the cover insulating film; and
   a protection insulating film formed on the second moisture-barrier insulating film and having a window on the first detection electrode film.

2. The surface-shape sensor according to claim 1, wherein the total film-thickness of the first and the second moisture-barrier insulating films is set to a minimum thickness necessary for preventing an intrusion of moisture.

3. The surface-shape sensor according to claim 2, wherein the first moisture-barrier insulating film and the second moisture-barrier insulating film are silicon-nitride films, the film-thickness of the second moisture-barrier insulating film is not more than 500 nm, and the total film-thickness is not less than 500 nm.

4. The surface-shape sensor according to claim 2 wherein the second moisture-barrier insulating film is a silicon-nitride film with a thickness of not more than 500 nm, the first moisture-barrier insulating film is a silicon-oxynitride film with a thickness of 1.2 times as thick as the value obtained by subtracting the thickness of the second moisture-barrier insulating film from 500 nm.

5. The surface-shape sensor according to claim 1, wherein the first moisture-barrier insulating film is an insulating metal-oxide film.

6. The surface-shape sensor according to claim 5, wherein the insulating metal-oxide film is any one of an aluminum-oxide film and a titanium oxide film.

7. The surface-shape sensor according to claim 1, wherein the cap insulating film is a silicon oxide film.

8. The surface-shape sensor according to claim 1, wherein the detection-electrode film is a film made of any one of titanium and a titanium compound.

9. The surface-shape sensor according to claim 8, wherein the titanium compound is any one of titanium nitride and titanium aluminum nitride.

10. The surface-shape sensor according to claim 1, wherein the distance between an upper surface of the detection-electrode film and an upper surface of the protection insulating film is not more than 1500 nm.

11. The surface-shape sensor according to claim 1, further comprising:
   a base insulating film formed over the semiconductor substrate; and
   a metal wiring formed on the base insulating film,
   wherein the interlayer insulating film is formed on the base insulating film and on the metal wiring, and has a hole on the metal wiring; and the detection-electrode film is electrically connected to the metal wiring through the hole.

12. The surface-shape sensor according to claim 1, wherein a ground electrode film that is independent of the detection-electrode film is formed on the first moisture-barrier insulating film beneath the window; and an opening is formed on the second moisture-barrier insulating film on the ground electrode film, and the ground electrode is exposed through the opening.

13. The surface-shape sensor according to claim 1, wherein the protection insulating film is made of a non-photosensitive polyimide.

14. A method of manufacturing a surface-shape sensor comprising:
- forming an interlayer insulating film over a semiconductor substrate;
- forming a first moisture-barrier insulating film on the interlayer insulating film;
- forming a cap insulating film on the first moisture-barrier insulating film;
- forming a first hole and second hole in the interlayer insulating film going through the cap insulating film and the first moisture-barrier insulating film;
- forming a detection-electrode film on the cap insulating film and inside the first hole and the second hole;
- removing the detection-electrode film except the detection-electrode film formed inside and around the first hole and the second hole so that the second hole couples electrically to the semiconductor substrate and the first hole couples to a source/drain region in the semiconductor substrate and a hollow is formed on the cap insulating film between the first hole and the second hole;
- forming a cover insulating film inside and around the first hole and the hollow;
- forming a second moisture-barrier insulating film on the cover insulating film; and
- forming a protection insulating film, having a window on the detection electrode film, on the second moisture-barrier insulating film.

15. The method of manufacturing a surface-shape sensor according to claim 14, further comprising
- annealing the interlayer insulating film in a nitrogen-containing atmosphere,
- wherein, after the annealing, forming the first moisture-barrier insulating film is carried out.

16. The method of manufacturing a surface-shape sensor according to claim 15, wherein, when forming the interlayer insulating film, an application-type silicon-oxide film is formed as the interlayer insulating film; and
- the forming the first moisture-barrier insulating film is carried out within twelve hours after annealing the interlayer insulating film is carried out.

17. The method of manufacturing a surface-shape sensor according to claim 14, further comprising:
- forming a base insulating film over the semiconductor substrate; and
- forming a metal wiring on the base insulating film,
- wherein, when forming the interlayer insulating film, the interlayer insulating film is formed on the base insulating film and on the metal wiring;
- after the interlayer insulating film is formed, forming the first hole and the second hole in the interlayer insulating film on the metal wiring is carried out, and, after the first hole and the second hole is formed, annealing the interlayer insulating film is carried out; and
- when forming the detection-electrode film, the detection-electrode film is formed inside the hole and on the interlayer insulating film.

18. The method of manufacturing a surface-shape sensor according to claim 17, wherein the forming the detection-electrode film is carried out within an hour after annealing the interlayer insulating film.

* * * * *